(12) United States Patent
Takao

(10) Patent No.: US 8,569,126 B2
(45) Date of Patent: Oct. 29, 2013

(54) SEMICONDUCTOR DEVICE AND MANUFACTURING METHOD THEREOF

(75) Inventor: Yoshihiro Takao, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/584,253

(22) Filed: Aug. 13, 2012

(65) Prior Publication Data
US 2012/0309143 A1 Dec. 6, 2012

Related U.S. Application Data

(62) Division of application No. 12/824,591, filed on Jun. 28, 2010, now abandoned.

(30) Foreign Application Priority Data

Jul. 7, 2009 (JP) ................................. 2009-160837

(51) Int. Cl.
*H01L 21/8238* (2006.01)
*H01L 21/8242* (2006.01)

(52) U.S. Cl.
USPC ..... 438/201; 438/199; 438/256; 257/E21.409

(58) Field of Classification Search
USPC ........... 438/197, 199, 201, 256; 257/E21.409
See application file for complete search history.

(56) References Cited

U.S. PATENT DOCUMENTS

| 2001/0025973 | A1 | 10/2001 | Yamada et al. |
| 2007/0246780 | A1* | 10/2007 | Watanabe et al. ............. 257/368 |
| 2008/0311718 | A1 | 12/2008 | Futase |

OTHER PUBLICATIONS

J. Kawahara et al, "A New Direct Low-k/Cu Dual Damascene (DD) Contact Lines for Low-loss (LL) CMOS Device Platforms", 2008 Symposium on VLSI Technology Digest of Technical Papers, Jun. 2008, pp. 106-107.

* cited by examiner

*Primary Examiner* — Walter H Swanson
*Assistant Examiner* — Wilner Jean Baptiste
(74) *Attorney, Agent, or Firm* — Westerman, Hattori, Daniels & Adrian, LLP

(57) ABSTRACT

A semiconductor device includes a silicon substrate in which active regions of a memory cell are defined, a gate electrode formed on a device isolation insulating film to extend in a first direction, a first insulating film formed on the silicon substrate and the gate electrode, a first plug formed to penetrate the first insulating film, to overlap with the gate electrode and the first active region, and to extend in a second direction perpendicular to the first direction, a second plug penetrating the first insulating film above the second active region, a second insulating film formed on the first insulating film, and an interconnection buried in the second insulating film, and formed to recede from a side surface of the first plug in the second direction and to cover only part of an upper surface of the first plug.

12 Claims, 38 Drawing Sheets

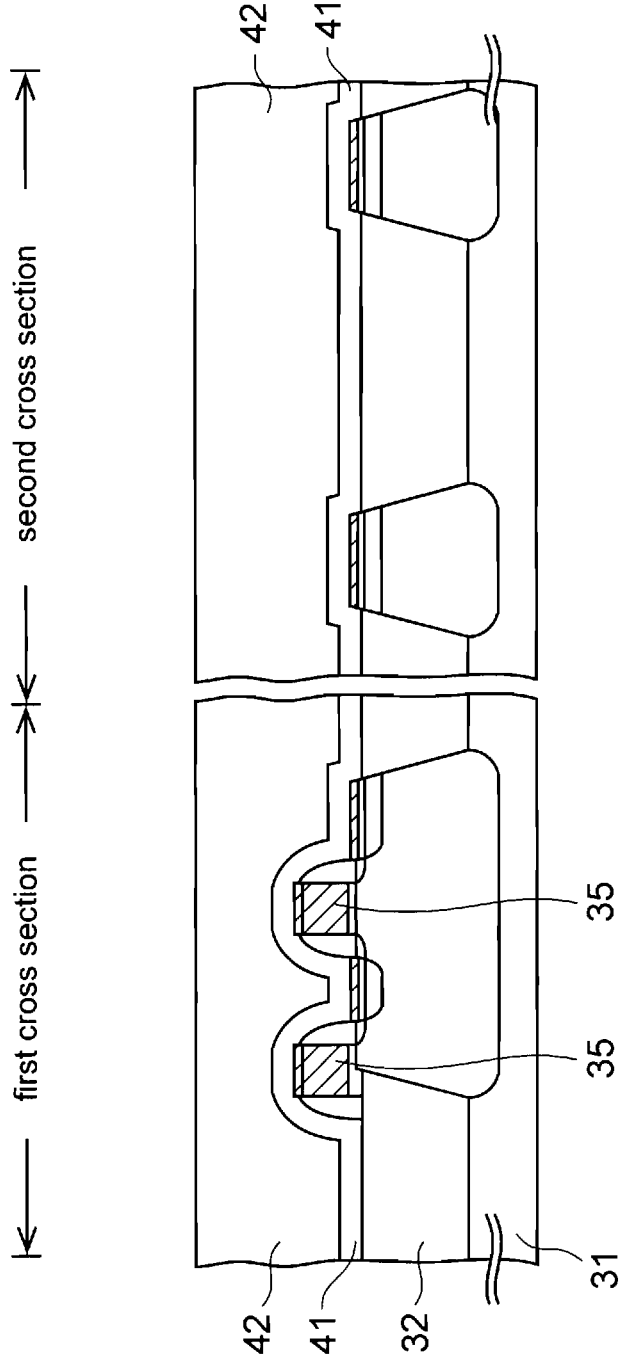

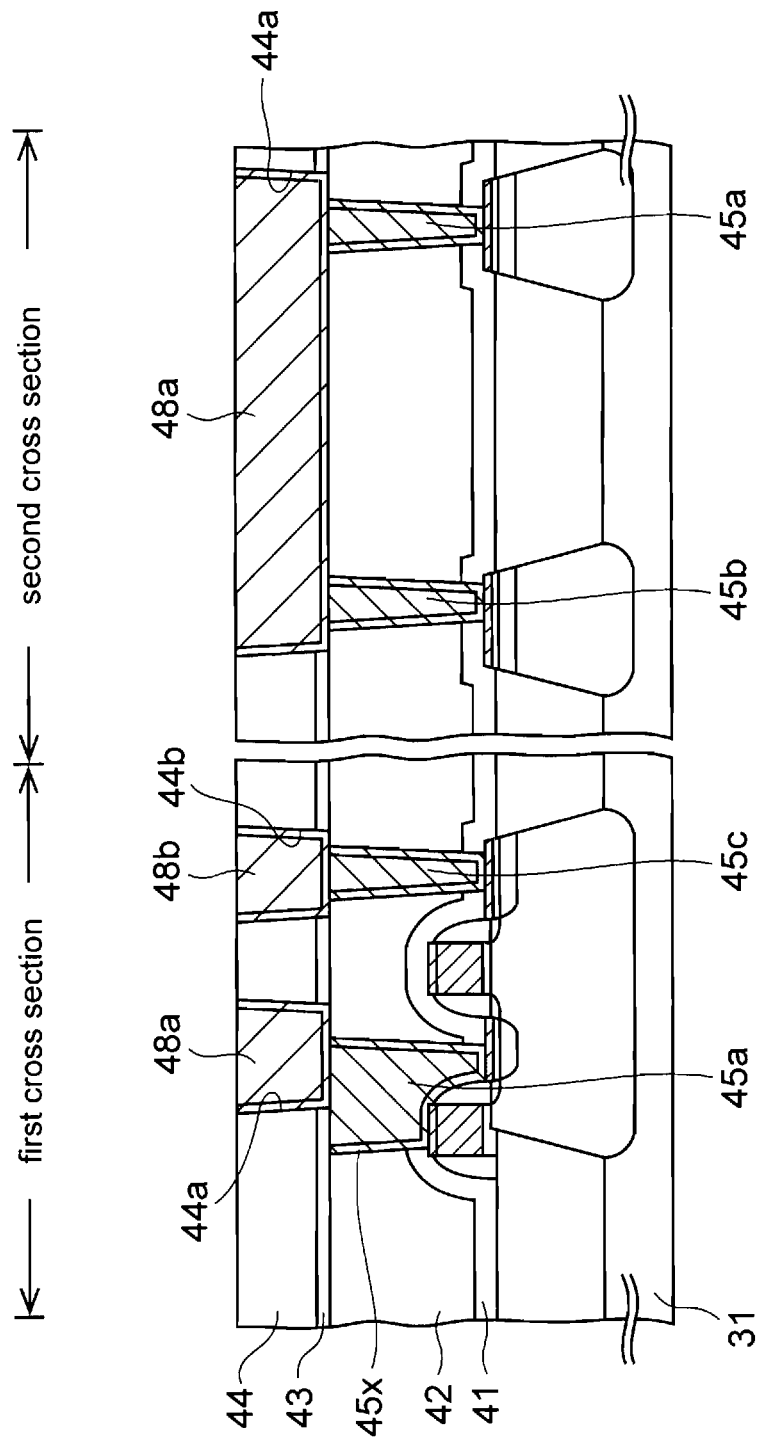

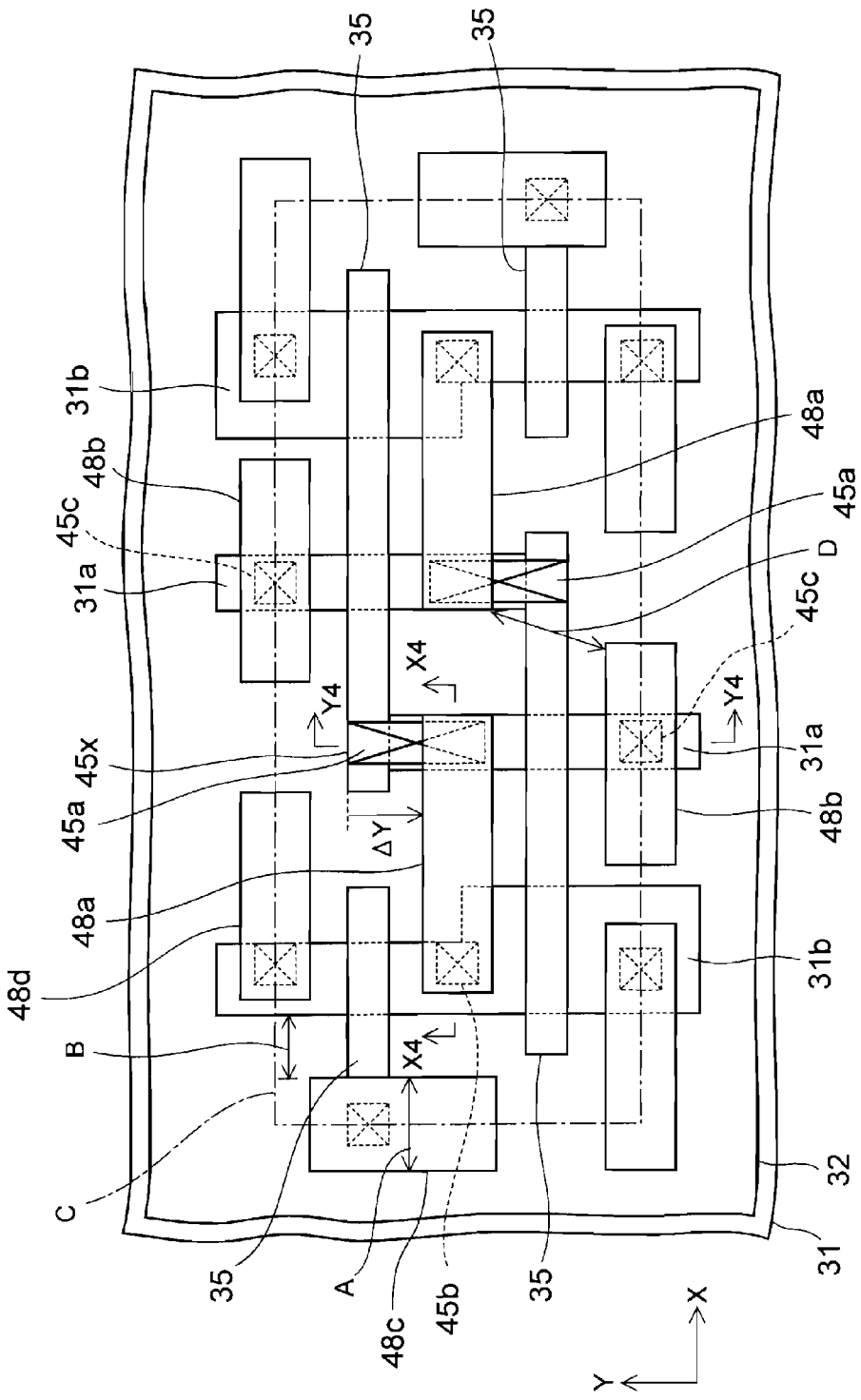

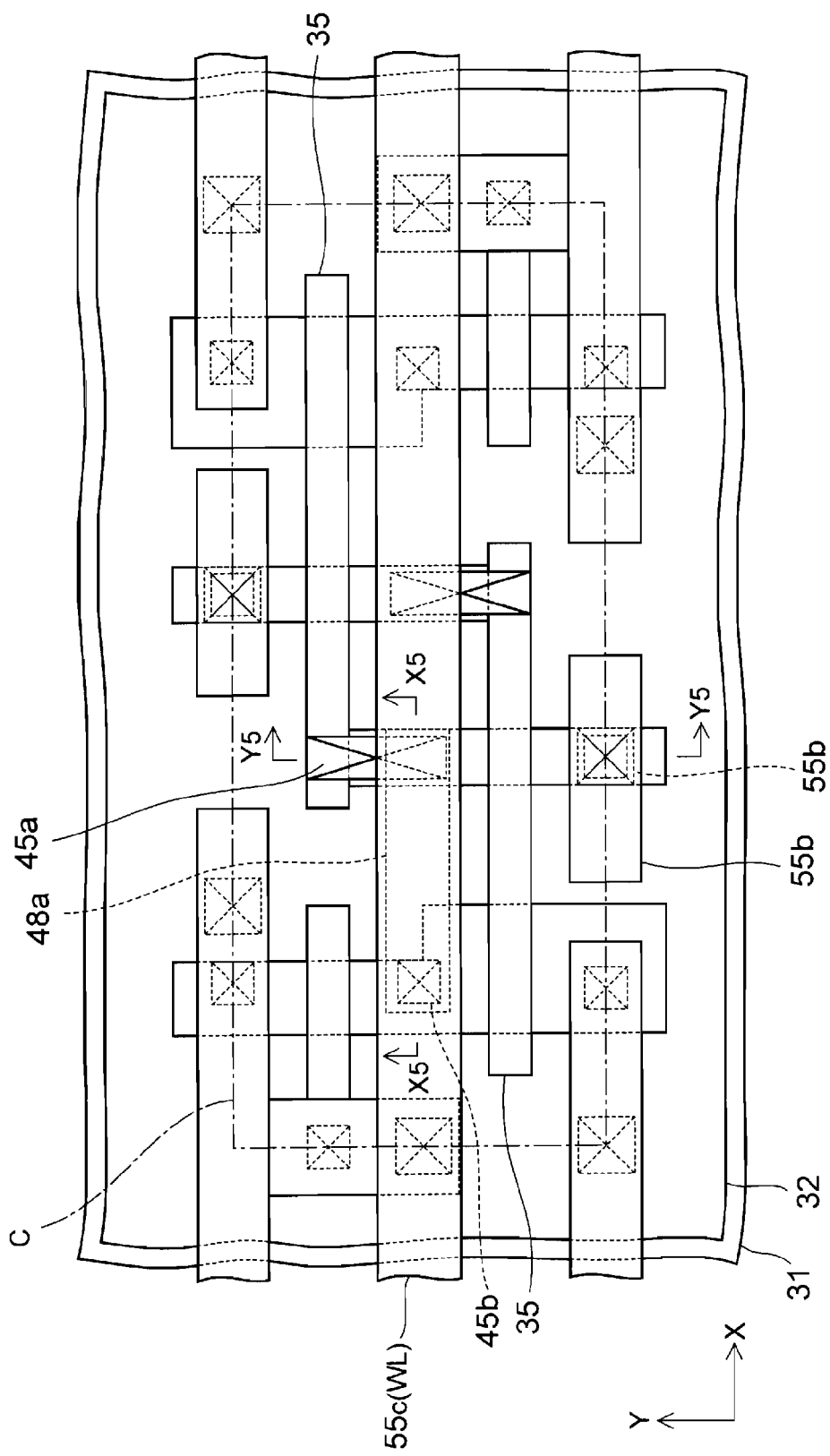

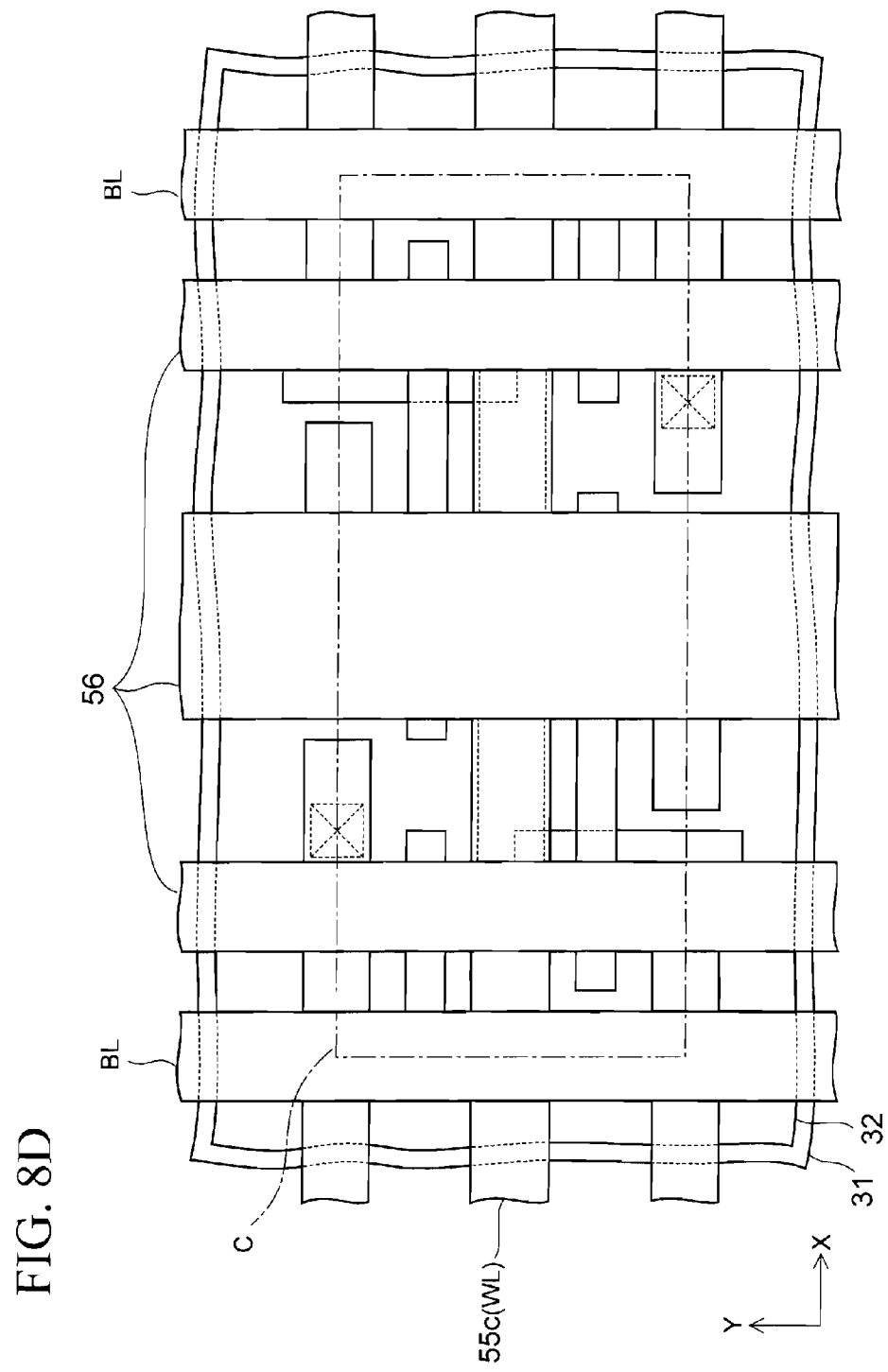

SEMICONDUCTOR DEVICE AND MANUFACTURING METHOD THEREOF

CROSS-REFERENCE TO RELATED APPLICATION

This is a divisional application of U.S. patent application Ser. No. 12/824,591 filed on Jun. 28, 2010, which is based upon and claims the benefit of priority of Japanese Patent Application NO. 2009-160837 filed on Jul. 7, 2009, the entire contents of each of which are incorporated herein by reference.

FIELD

It is related to a semiconductor device and a manufacturing method thereof.

BACKGROUND

There are various types of volatile memories formed on semiconductor substrates. Among them, a SRAM (static random access memory) is able to achieve high-speed operation and is utilized for a cache memory and the like.

A memory cell in the SRAM includes a flip-flop circuit formed of multiple MOS transistors. Information is stored in the flip-flop circuit.

Reduction in the cell size of the SRAM can contribute to downsizing of an electronic device including the SRAM such as a calculator.

Note that 2008 Symposium on VLSI Technology Digest of Technical Papers, p. 106-107, 2008 discloses techniques related to the SRAM.

SUMMARY

According to one aspect discussed herein, there is provided a semiconductor device including a semiconductor substrate in which a first active region and a second active region of a memory cell of a static random access memory are defined by a device isolation insulating film, a gate electrode formed over the device isolation insulating film and the first active region, and extending in a first direction, a first insulating film formed over the semiconductor substrate and the gate electrode, a first plug formed to penetrate the first insulating film, to overlap with the gate electrode and the first active region, and to have a rectangular planar shape extending in a second direction perpendicular to the first direction, a second plug formed to penetrate the first insulating film over the second active region, a second insulating film formed over the first insulating film, and a interconnection buried in the second insulating film, and formed to extend from a position over the first c plug to a position over the second plug while receding from a side surface of the plug in the second direction, and to cover only a part of an upper surface of the first plug.

According to another aspect discussed herein, there is provided a semiconductor device including a semiconductor substrate in which a first active region and a second active region are defined by a device isolation insulating film, a gate electrode formed over the device isolation insulating film and the first active region and extending in a first direction, a first insulating film formed over the semiconductor substrate and the gate electrode, a first plug formed to penetrate the first insulating film, to overlap with the gate electrode and the first active region, and to have a rectangular planar shape extending in a second direction perpendicular to the first direction, a second plug formed to penetrate the first insulating film and the second insulating film over the second active region, a interconnection formed in the second insulating film, formed integrally with the first plug and the second plug, and extending from a position over the first plug to a position over the second copper-containing plug, and a third plug formed to penetrate the first insulating film and the second insulating film.

According to yet another aspect discussed herein, there is disclosed a method of manufacturing a semiconductor device including defining, in a semiconductor substrate, a first active region and a second active region of a memory cell of a static random access memory by forming a device isolation insulating film over the semiconductor substrate, forming a gate electrode, extending in a first direction, over the device isolation insulating film and the first active region, forming a first insulating film over the semiconductor substrate and the gate electrode, forming a first hole in the first insulating film, the first hole overlapping with the gate electrode and the first active region and having a rectangular planar shape extending in a second direction perpendicular to the first direction, forming a second hole in the first insulating film over the second active region, forming a first plug and a second plug respectively in the first hole and the second hole, forming a second insulating film over the first plug, the second plug, and the first insulating film, forming a trench in the second insulating film, the trench extending from a position over the first plug to a position over the second plug, the trench being formed at a distance from a side surface of the first plug in the second direction, and forming a interconnection in the trench.

According to still another aspect discussed herein, there is provided a method of manufacturing a semiconductor device including defining, in a semiconductor substrate, a first active region and a second active region of a memory cell of a static random access memory by forming a device isolation insulating film over the semiconductor substrate, forming a gate electrode, extending in a first direction, over the device isolation insulating film and the first active region, forming a first insulating film over the semiconductor substrate and the gate electrode, forming a second insulating film over the first insulating film, forming a first hole, a second hole and a third hole by patterning the first insulating film and the second insulating film, the first hole having a rectangular planar shape overlapping with the gate electrode and the first active region and extending in a second direction perpendicular to the first direction, the second hole being located over the second active region, forming a trench by patterning the second insulating film, the trench extending from a position over the first hole to a position over the second hole, and forming first, second, and third plugs in the first, second, and third holes and forming an interconnection in the trench, thereby forming the interconnection integrally formed with the first plug and the second plug.

Other objects and further features of the present application will become apparent from the following detailed description when read in conjunction with the attached drawings.

BRIEF DESCRIPTION OF THE DRAWINGS

FIGS. 5A to 5J are cross-sectional views during manufacture of a semiconductor device according to a first embodiment;

FIGS. 6A to 6F are plan views during manufacture of the semiconductor device according to the first embodiment;

FIGS. 8A to 8D are plan views during manufacture of the semiconductor device according to the second embodiment;

DESCRIPTION OF EMBODIMENTS

Prior to explaining the present embodiments, preliminary matter will be explained.

The inventor has conducted various studies on planar layouts of memory cells in order to achieve reduction in the cell size of a SRAM.

Figure 1:
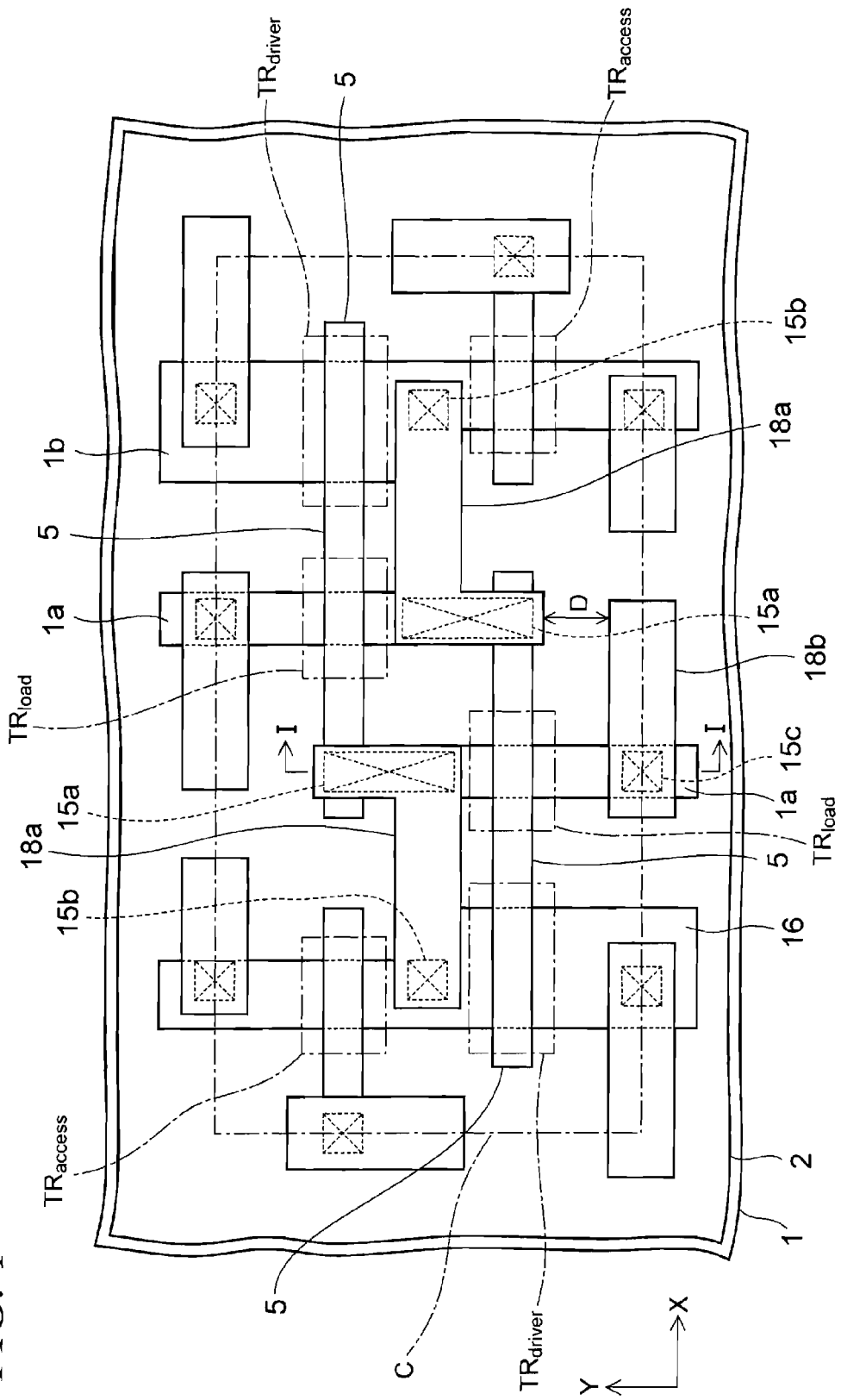
FIG. 1 is an enlarged plan view illustrating an example of a planar layout of a SRAM memory cell.

FIG. 1 illustrates one of such planar layouts which is an enlarged plan view of a memory cell C in the SRAM. In FIG. 1, a word-line direction is indicated by X while a bit-line direction is indicated by Y.

In this example, a device isolation insulating film 2 for STI (shallow trench isolation) is formed on a silicon substrate 1 and first active regions 1a and second active regions 1b of the silicon substrate 1 are defined by this device isolation insulating film 2.

Moreover, gate electrodes 5 made of polycrystalline silicon are formed on these active regions 1a and 1b and on the device isolation insulating film 2 so as to extend in the word-line direction.

Two driver transistors $TR_{drive}$, two access transistors $TR_{access}$, and two load transistors $TR_{load}$ are formed in a memory cell C at portions where the gate electrodes 5 overlap with the active regions 1a and 1b, as illustrated in FIG. 1.

Further, first to third tungsten plugs 15a to 15c for drawing source-drain regions of the above-described transistors $TR_{drive}$, $TR_{access}$, and $TR_{load}$ to an upper layer are formed on the active regions 1a and 1b.

Among these tungsten plugs, the first tungsten plug 15a has a rectangular planar shape overlapping with the gate electrode 5 and the first active region 1a, and has a function to connect the gate electrode 5 directly to the first active region 1a. This plug is also referred to as a shared contact.

Meanwhile, a first copper-containing interconnection 18a having an L-shaped planar shape is formed on this first tungsten plug 15a. The first copper-containing interconnection 18a extends in the bit-line direction Y and plays a role in connecting the first tungsten plug 15a to the second tungsten plug 15b.

Moreover, the first copper-containing interconnection 18a is formed to cover the entire upper surface of the first tungsten plug 15a in order to reduce contact resistance with the first tungsten plug 15a.

In the meantime, a copper-containing pad 18b having a rectangular planar shape extending in the word-line direction X is formed on the third tungsten plug 15c.

Figure 2:
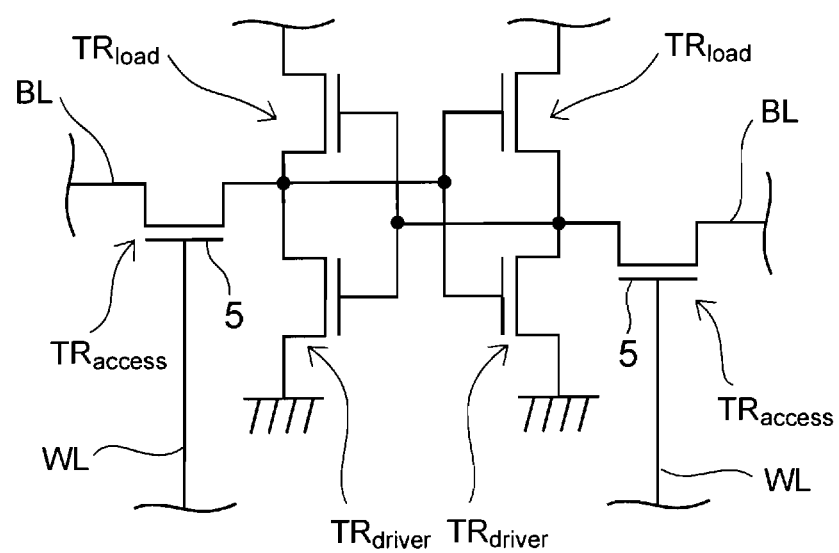
FIG. 2 is an equivalent circuit diagram of the SRAM memory cell.

FIG. 2 is an equivalent circuit diagram of the memory cell C of this SRAM.

As illustrated in FIG. 2, in one memory cell C, the respective gate electrodes 5 of the two access transistors $TR_{access}$ are electrically connected to word lines WL. Meanwhile, a bit line BL is electrically connected to the respective source-drain regions of the two access transistors $TR_{access}$.

Figure 3:
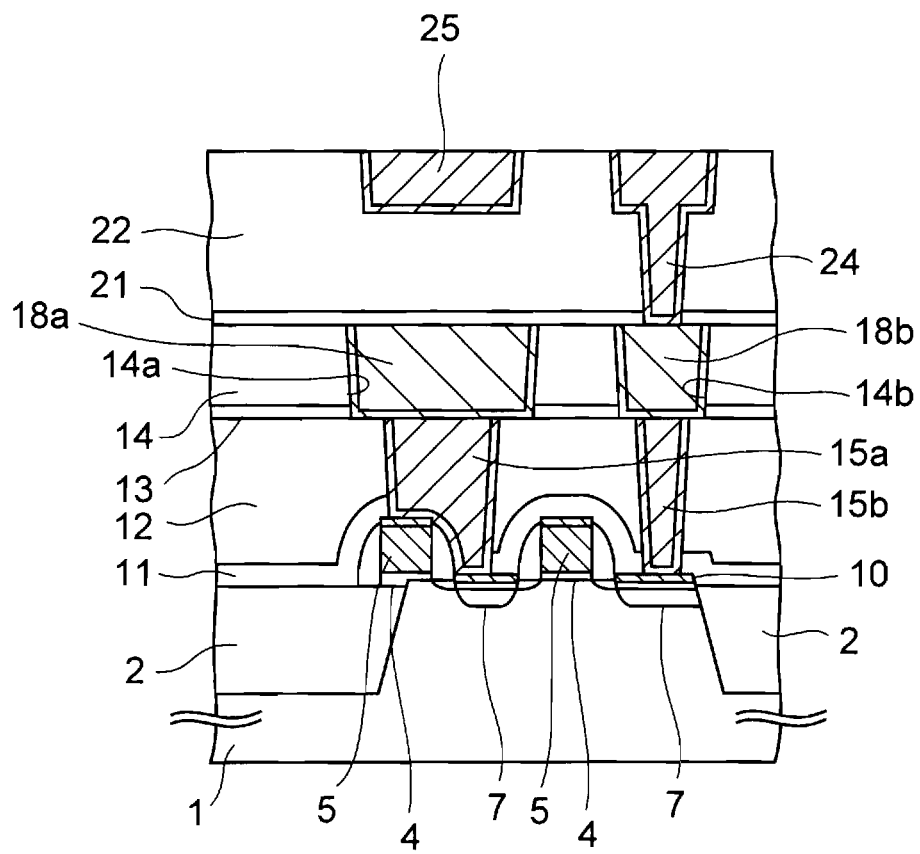
FIG. 3 is a cross-sectional view taken along an I-I line in FIG. 1.

FIG. 3 is a cross-sectional view taken along an I-I line in FIG. 1.

As illustrated in FIG. 3, the gate electrodes 5 are formed on the silicon substrate 1 with gate insulating films 4, each made of a thermal oxide film, interposed therebetween.

Meanwhile, p-type source-drain regions 7 are formed in the silicon substrate 1 beside the gate electrodes 5, and resistance in surface layer portions of the source-drain regions 7 is reduced by refractory metal silicide layers 10 such as nickel silicide layers.

Then, a cover insulating film 11 made of silicon nitride and a first insulating film 12 made of silicon oxide are formed in this order on the gate electrodes 5, and the first tungsten plug 15a and the second tungsten plug 15b described above are buried in these insulating films 11 and 12.

Moreover, a first copper diffusion prevention insulating film 13 made of silicon carbide (SiC) and a second insulating film 14 made of silicon oxide are formed in this order on the first insulating film 12.

A first trench 14a and a second trench 14b are formed in these insulating films 13 and 14, and the first copper-containing interconnection 18a and the copper-containing pad 18b described above are buried in these trenches by a single damascene method. As described previously, the first copper-containing interconnection 18a is formed to cover the entire upper surface of the first tungsten plug 15a in order to reduce the contact resistance with the first tungsten plug 15a.

Further, a second copper diffusion prevention insulating film 21 made of silicon carbide and a third insulating film 22 made of silicon oxide are formed on the first copper-containing interconnection 18a, the copper-containing pad 18b, and the second insulating film 14.

A second copper-containing interconnection 25 and a copper-containing plug 24 are buried in the third insulating film 22. Here, the copper-containing plug 24 is electrically connected to the second copper-containing plug 15b via the copper-containing pad 18b.

By connecting the vertically located plugs 15b and 24 to each other via the copper-containing pad 18b as described above, it is possible to ensure the contact areas between the copper-containing pad 18b and the respective plugs 15b and 24, and thereby to prevent an increase in the contact resistance between these plugs 15b and 24.

Moreover, the area of the copper-containing pad 18b is increased by forming the planar shape of the copper-containing pad 18b into the rectangle that extends in the word-line direction as illustrated in FIG. 1. Therefore, when forming the second trench 14b by photolithography for burying therein the copper-containing pad 18b, the shape of the trench 14b is less affected by an optical proximity effect. In this way, it is possible to suppress deformation of the shape of the copper-containing pad 18b and thereby to achieve the above-described effect of preventing the increase in the contact resistance between the respective plugs 15b and 24.

However, according to the planar layout of the SRAM illustrated in FIG. 1, the first copper-containing interconnection 18a is formed into the L-shaped planar shape in order to cover the entire upper surface of the first tungsten plug 15a.

As a consequence, a distance D between the first copper-containing interconnection 18a and the copper-containing pad 18b is reduced.

Therefore, it is necessary to separate the first copper-containing interconnection 18a from the copper-containing pad 18b along the bit-line direction Y in order to reduce a risk of an electrical short circuit between the first copper-containing interconnection 18a and the copper-containing pad 18b attributable to the shorter distance D. Accordingly, this structure has a problem that it is not possible to achieve reduction in the area of the memory cell C because the memory cell C is extended in the bit-line direction Y.

Further, the first copper-containing interconnection 18a having the L-shape has the more complicated contour as compared to a straight interconnection. Accordingly, OPC (optical proximity correction) processing to be performed on an exposure mask used for forming the first trench 14a in the lithography is also complicated. For this reason, there is another problem that it takes a long time for designing the SRAM due to time-consuming calculation for the OPC.

On the other hand, as the generation of the MOS transistors advances and gate lengths thereof are shortened, the diameters of the tungsten plugs also need to be formed smaller so as to achieve reduction in size of the MOS transistors. However, the smaller diameters of the tungsten plugs may increase the resistance of tungsten plugs and may adversely affect characteristics of the MOS transistors.

Figure 4:
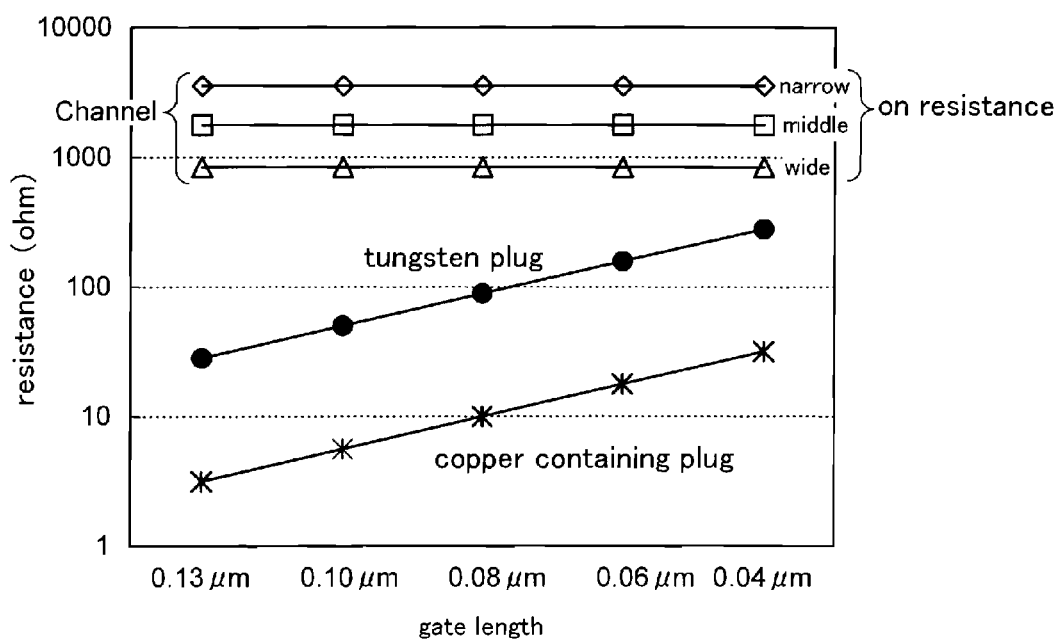
FIG. 4 is a graph illustrating a relation between a gate length of a MOS transistor and resistance of a tungsten plug having a diameter suitable for the gate length.

FIG. 4 is a graph illustrating a relation between a gate length of a MOS transistor and resistance of a tungsten plug having a diameter suitable for the gate length.

Note that FIG. 4 also illustrates a relation between the gate length and resistance of a copper-containing plug having a diameter suitable for the gate length for the purpose of comparison. Moreover, on resistance of the MOS transistor is also illustrated in FIG. 4. Here, the on resistance is resistance between a source and drain when the gate of the MOS transistor is in an on state. FIG. 4 illustrates the on resistance in three types of channel widths, namely, wide, middle, and narrow widths in order to indicate how much the on resistance varies depending on the size of the channel width.

It is deemed desirable to set the resistance of the plug equal to or below about 1/10 as large as the on resistance in order to operate the MOS transistor normally.

As illustrated in FIG. 4, the resistance of the tungsten plug exceeds 1/10 of the on resistance in a generation where the gate length is shorter than 45 nm. Hence, it is understood that the tungsten plugs are unsuitable in this generation or later.

On the other hand, the resistance of the copper-containing plug exhibits a value equal to or below 1/10 of the on resistance even in the generation where the gate length is shorter than 45 nm.

Accordingly, in the above-described SRAM using the first to third tungsten plugs 15a to 15c, it is not possible to reduce the gate lengths of the transistors $TR_{drive}$, $TR_{access}$, and $TR_{load}$ without affecting the characteristics of these transistors.

In view of this knowledge, the inventor has achieved embodiments as described below.

First Embodiment

FIGS. 5A to 5J are cross-sectional views during manufacture of a semiconductor device according to this embodiment and FIGS. 6A to 6F are plan views thereof.

Note that both of a first cross section taken along the word-line direction and a second cross section taken along the bit-line direction are illustrated throughout FIGS. 5A to 5J. The same applies to respective cross-sectional views illustrated in conjunction with a second embodiment and a third embodiment to be described later.

This semiconductor device is a SRAM, which is manufactured as described below.

Figure 5A:
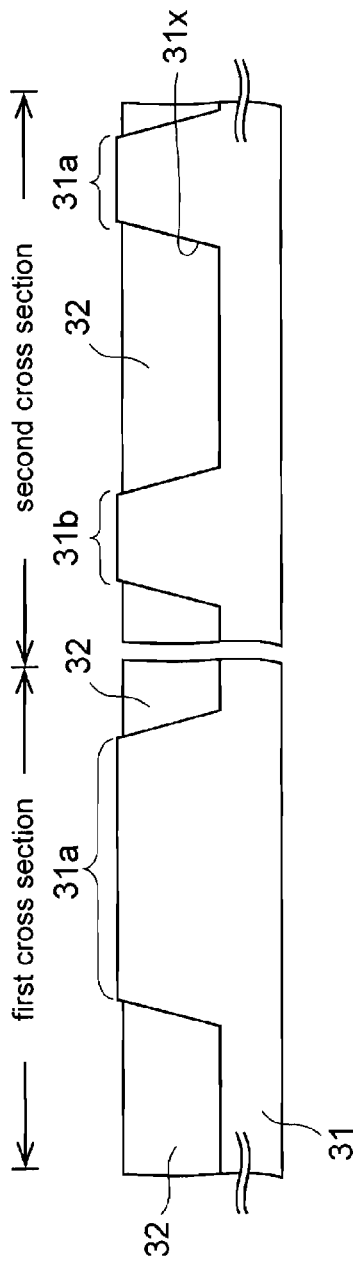

First, as illustrated in FIG. 5A, a device isolation trench 31x having a depth of about 300 nm is formed on a silicon substrate 31 serving as a semiconductor substrate.

Then, after a silicon oxide film serving as a device isolation insulating film 32 for the STI is formed on the entire upper surface of the silicon substrate 31 by a CVD (chemical vapor deposition) method, an excessive portion of the device isolation insulating film 32 on the surface of the silicon substrate 31 is polished and removed by a CMP (chemical mechanical polishing) method, thereby leaving the device isolation insulating film 32 only in the device isolation trench 31x.

Thereafter, the device isolation insulating film 32 is subjected to annealing under conditions of a substrate temperature of about 1000° C. and processing time of about 30 seconds in order to increase a film density of the device isolation insulating film 32.

Figure 6A:
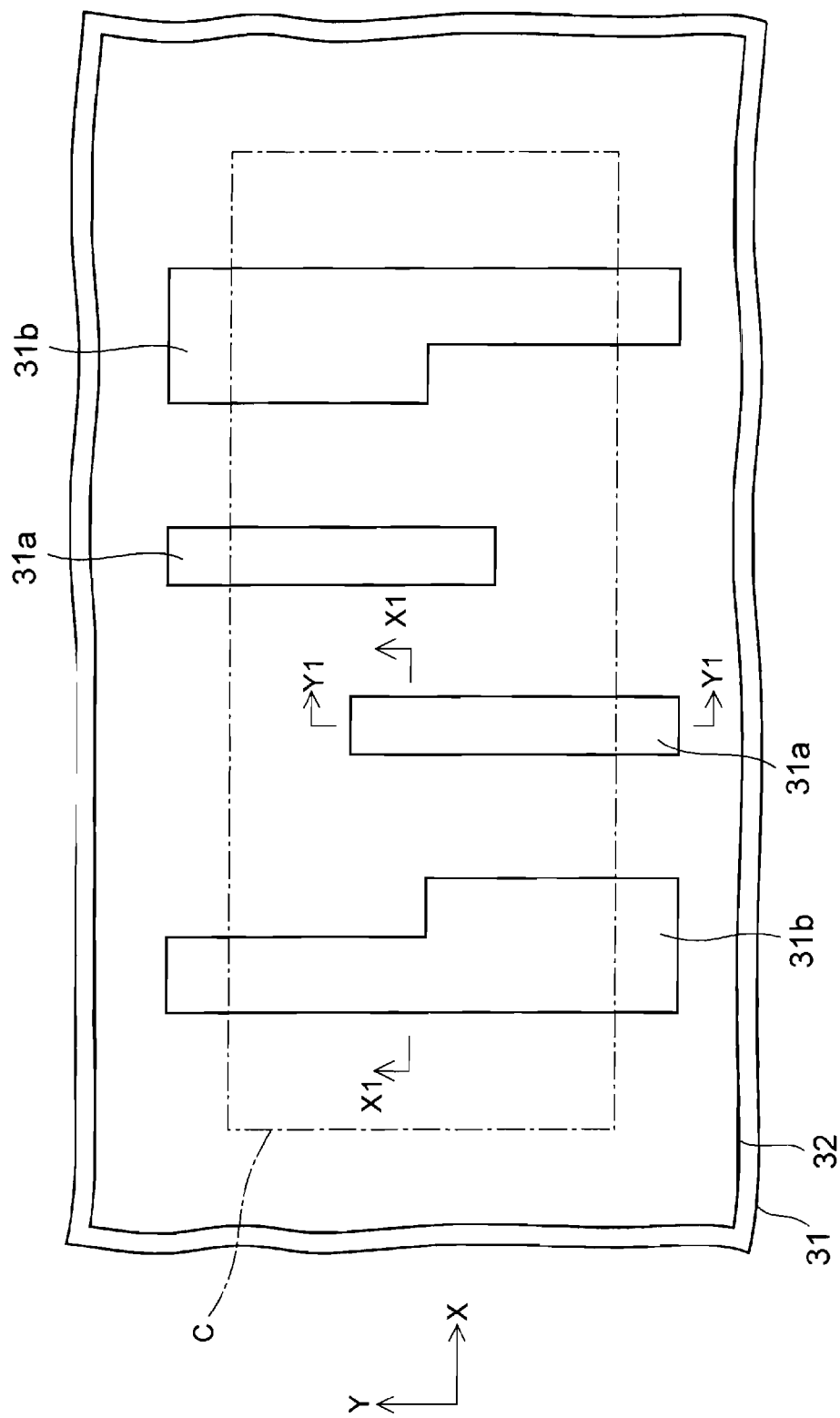

FIG. 6A is the plan view after completion of the above-described steps. Here, the second cross section in FIG. 5A corresponds to a cross section taken along an X1-X1 line in FIG. 6A and the first cross section in FIG. 5A corresponds to a cross section taken along a Y1-Y1 line in FIG. 6A.

Moreover, the word-line direction is indicated by X while the bit-line direction perpendicular thereto is indicated by Y in FIG. 6A.

As illustrated in FIG. 6A, first active regions 31a and second active regions 31b are defined in the silicon substrate 31 by the device isolation insulating film 32. All of these active regions 31a and 31b extend in the bit-line direction Y.

Next, steps to be carried out in order to obtain a cross-sectional structure illustrated in FIG. 5B will be described.

First, phosphorus is ion-implanted into the silicon substrate 31 in the first active region 31a under conditions of acceleration energy of 300 keV and a dose amount of $3 \times 10^{13}$ cm$^{-2}$, thereby forming an n-well 33.

Further, an n-type impurity diffused region for threshold adjustment is formed at a surface layer portion of the n-well 33 by ion implantation. As for the n-type impurity, arsenic is ion-implanted under conditions of acceleration energy of 100 keV and a dose amount of $4 \times 10^{12}$ cm$^{-2}$, for example.

In the meantime, a p-well 39 and a p-type impurity diffused region for threshold adjustment are formed in the second active region 31b. In order to form the p-well 39, boron is ion-implanted under conditions of acceleration energy of 150 keV and a dose amount of $3 \times 10^{13}$ cm$^{-2}$, for example. Meanwhile, as for the p-type impurity for threshold adjustment, boron is ion-implanted under conditions of acceleration energy of 10 keV and a dose amount of $4 \times 10^{12}$ cm$^{-2}$, for example.

Subsequently, an annealing process is performed under conditions of a substrate temperature of 1000° C. and processing time of 10 seconds for the purpose of diffusing the impurities in the respective wells 33 and 39. Such an annealing process is also referred to as well annealing.

Then, a thermal oxide film having a thickness of about 1.2 nm is formed as a gate insulating film 34 by thermally oxidizing the surface of the silicon substrate 31. Although conditions of the thermal oxidation are not particularly limited, the gate insulating film 34 of this embodiment is formed by a RTO (rapid thermal oxidation) method under a condition of a substrate temperature of about 900° C.

Moreover, a polycrystalline silicon film having a film thickness of about 100 nm is formed on the gate insulating film 34 by a CVD method, and a gate electrode 35 is formed by patterning the polycrystalline silicon film.

Thereafter, boron serving as a p-type impurity is ion-implanted into the silicon substrate 31 while using the gate electrode 35 as a mask, thereby forming a p-type source-drain extension 36a in the silicon substrate 31 in the first active region 31a. Conditions for the ion implantation include acceleration energy of 0.5 keV and a dose amount of $1 \times 10^{15}$ cm$^{-2}$, for example.

In the meantime, arsenic is ion-implanted into the silicon substrate 31 in the second active region 31b under conditions of acceleration energy of 3 keV and a dose amount of $1 \times 10^{15}$ cm$^{-2}$, thereby forming an n-type source-drain extension 36b.

Then, after forming an insulative side wall 38 made of a silicon oxide film beside the respective gate electrodes 35, a p-type source-drain region 37a is formed by ion-implanting a p-type impurity into the silicon substrate 31 in the first active region 31a. As for the p-type impurity, boron is ion-implanted under conditions of acceleration energy of 5 keV and a dose amount of $2 \times 10^{15}$ cm$^{-2}$.

In the meantime, phosphorus serving as an n-type impurity is ion-implanted into the silicon substrate 31 in the second active region 31b under conditions of acceleration energy of 15 keV and a dose amount of $2 \times 10^{15}$ cm$^{-2}$, thereby forming an n-type source-drain region 37b.

Thereafter, a stacked film including a nickel film and a titanium nitride film is formed on the entire upper surface of the silicon substrate 31 by a sputtering method, and then a refractory metal silicide layer 40 such as a nickel silicide layer is formed by annealing the stacked film to be reacted with the silicon. Although conditions for the annealing are not particularly limited, the substrate temperature is set in a range from 400° C. to 550° C. while the processing time is set in a range from several seconds to several tens of minutes in this embodiment. Meanwhile, the thickness of the nickel film is set in a range from 5 nm to 20 nm, for example.

After the annealing process, the unreacted nickel film on the device isolation insulating film 32 is removed by a wet etching method using a mixed solution of sulfuric acid and hydrogen peroxide water as an etchant. As a result, the refractory metal silicide layer 40 is left only on the source-drain regions 37a and 37b and on the gate electrodes 35.

Figure 5B:
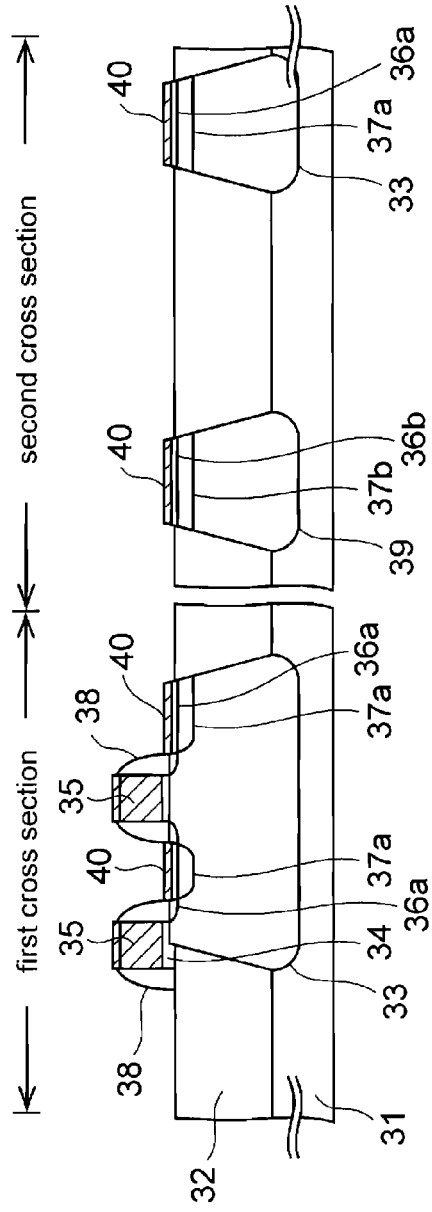
Figure 6B:
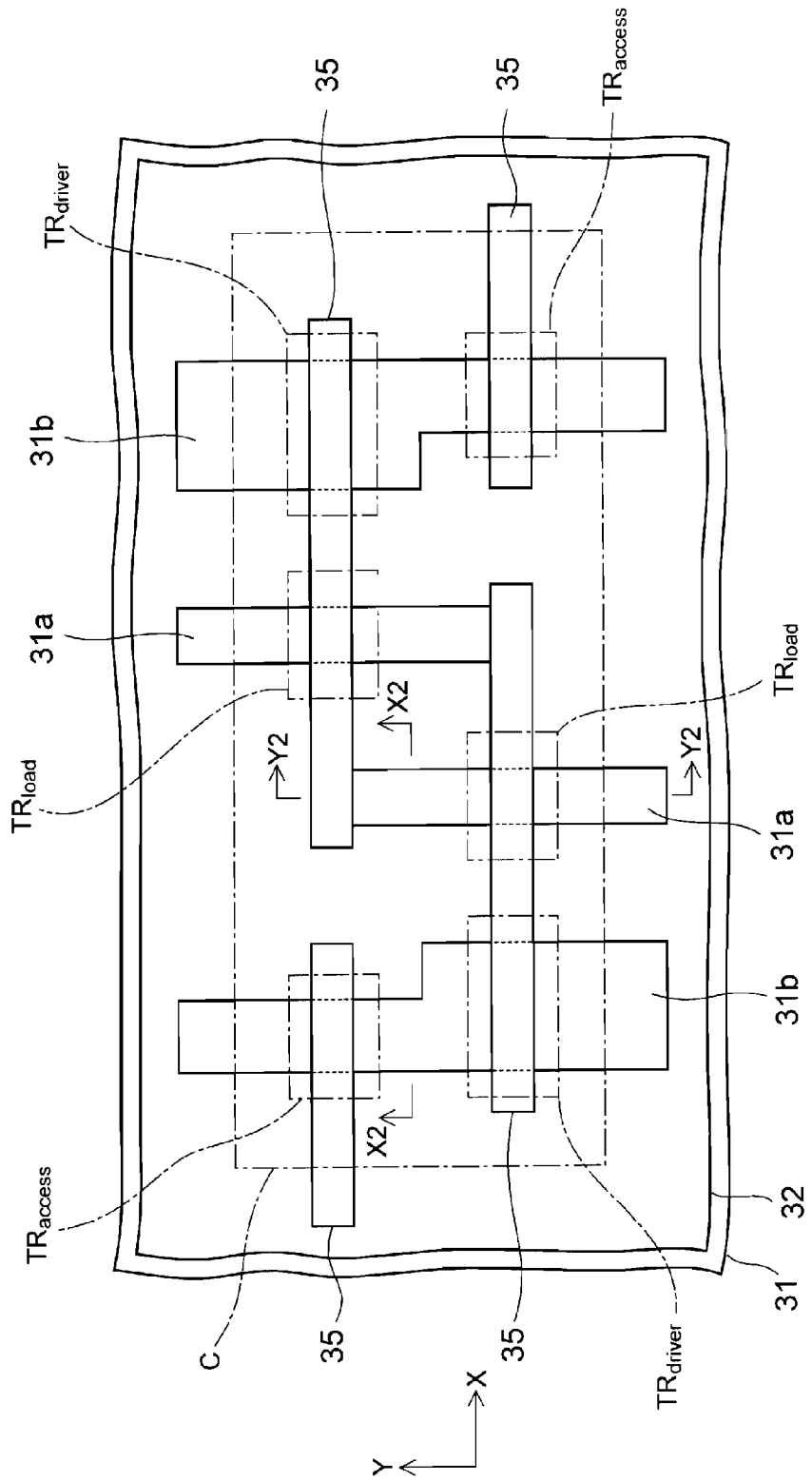

FIG. 6B is the plan view after completion of the above-described steps. Here, the second cross section in FIG. 5B corresponds to a cross section taken along an X2-X2 line in FIG. 6B and the first cross section in FIG. 5B corresponds to a cross section taken along a Y2-Y2 line in FIG. 6B.

As illustrated in FIG. 6B, the gate electrodes 35 are formed respectively on the device isolation insulating film 32 and on the active regions 31a and 31b.

Moreover, two driver transistors TR$_{drive}$, two access transistors TR$_{access}$, and two load transistors TR$_{load}$ are formed in a memory cell C as illustrated in FIG. 6B at portions where the gate electrodes 35 overlap with the respective active regions 31a and 31b.

Meanwhile, the access transistors TR$_{access}$ and the driver transistors TR$_{drive}$ share the respective source-drain region in the second active regions 31b.

An equivalent circuit of the memory cell including these transistors TR$_{drive}$, TR$_{access}$, and TR$_{load}$ is similar to FIG. 2 illustrated in conjunction with the preliminary matter.

Subsequently, as illustrated in FIG. 5C, a silicon nitride film serving as a cover insulating film 41 is formed in a thickness of about 50 nm on the entire upper surface of the silicon substrate 31 by the CVD method.

Moreover, a silicon nitride film is formed in a thickness of about 500 nm on the cover insulating film 41 by a thermal CVD method. The silicon oxide film thus formed is used as a first insulating film 42.

Figure 5D:
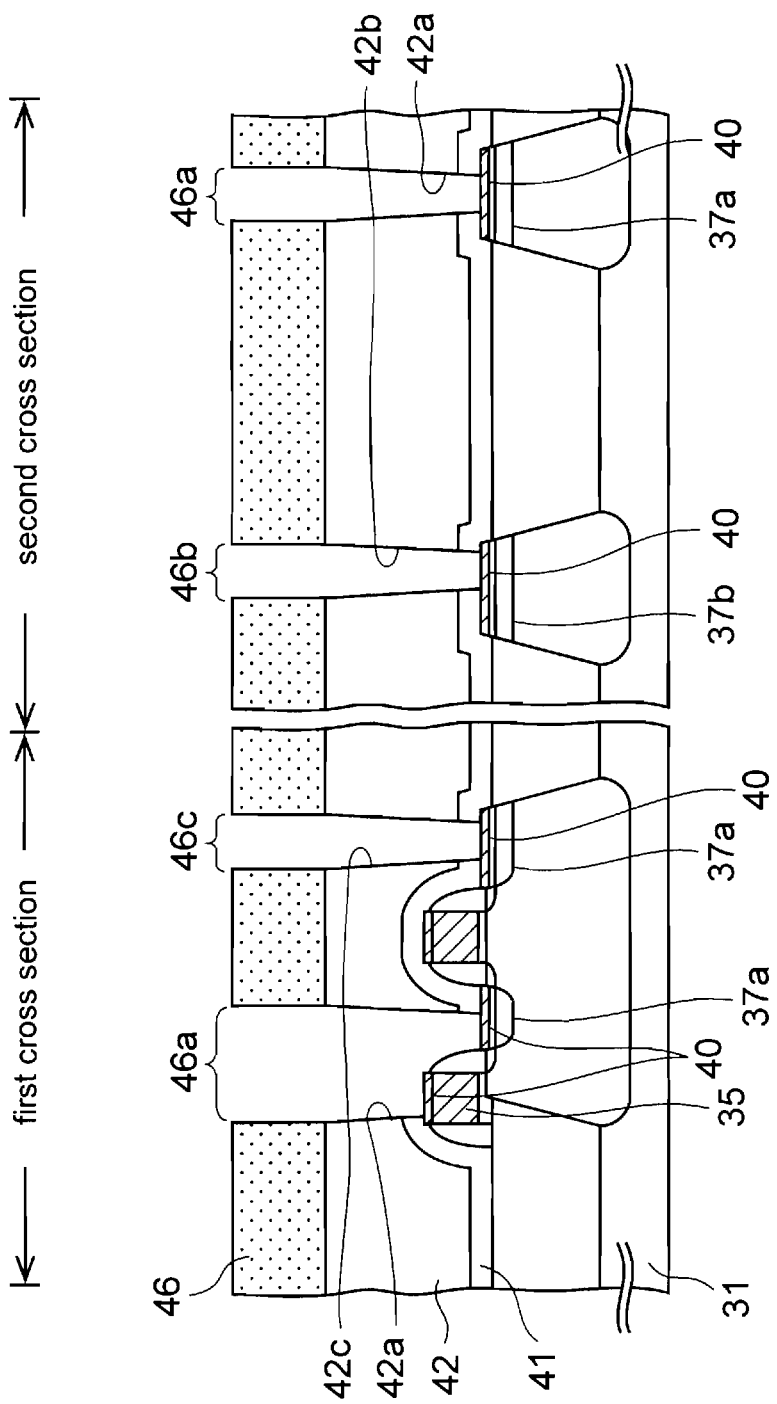

Subsequently, as illustrated in FIG. 5D, a photoresist is coated on the first insulating film 42, and a first resist pattern 46 provided with hole-shaped windows 46a to 46c is formed by exposing and developing the photoresist.

Then, the cover insulating film 41 and the first insulating film 42 are dry etched using the first resist pattern 46 as a mask, thereby forming first to third holes 42a to 42c on these insulating films.

The dry etching is performed by RIE (reactive ion etching) to change etching gases between an etching process on the first insulating film 42 and an etching process on the cover insulating film 41. In the etching process on the first insulating film 42, mixed gas of $C_2F_6$ gas and $CH_3$ gas is used as an etching gas while the cover insulating film 41 serves as an etching stopper. Meanwhile, in the etching process on the cover insulating film 41, $CF_4$ gas is used as an etching gas while the refractory metal silicide layer 40 serves as an etching stopper.

As illustrated in the first cross section, both of the first hole 42a and the third hole 42c are formed on the p-type source-drain region 37a, and the first hole 42a is formed to further overlap with the gate electrode 35.

Meanwhile, as illustrated in the second cross section, the second hole 42b is formed on the n-type source-drain region 37b.

Thereafter, the first resist pattern 46 is removed.

Next, steps to be carried out in order to obtain a cross-sectional structure illustrated in FIG. 5E will be described.

First, a tantalum film and a tantalum nitride film are formed in this order as a barrier metal film in the respective holes 42a to 42c and on an upper surface of the first insulating film 42 by the sputtering method. As for film thicknesses of the respective films, the tantalum film is set to about 5 nm while the tantalum nitride film is set to about 10 nm.

Then, a copper film is formed as a seed layer on this barrier metal film by the sputtering method and a copper plated film is formed using the seed layer as a power feeding layer, thereby completely burying the respective holes 42a to 42c with the copper plated film.

Thereafter, the excessive copper plated film, the seed layer, and the barrier metal film on the first insulating film 42 are polished and removed by the CMP method. In this way, first to third copper-containing plugs 45a to 45c penetrating the first insulating film 42 are formed inside the respective holes 42a to 42c.

Figure 5E:
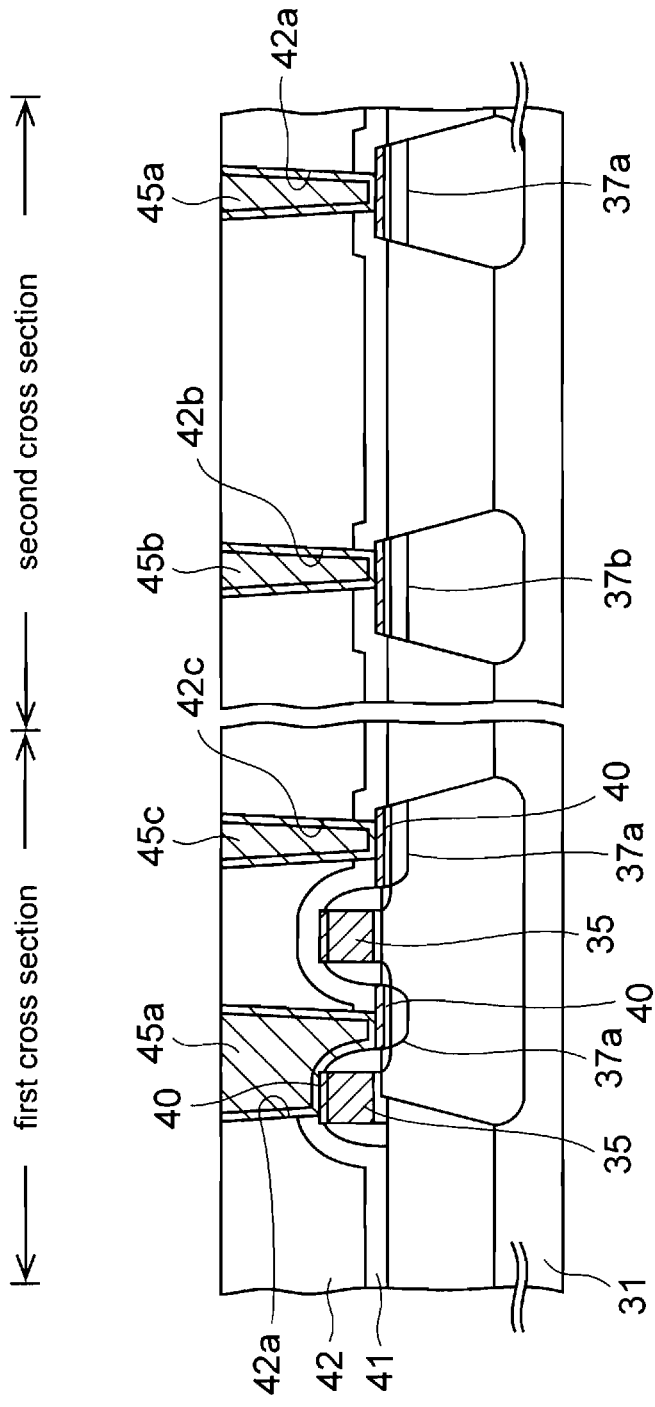
Figure 6C:
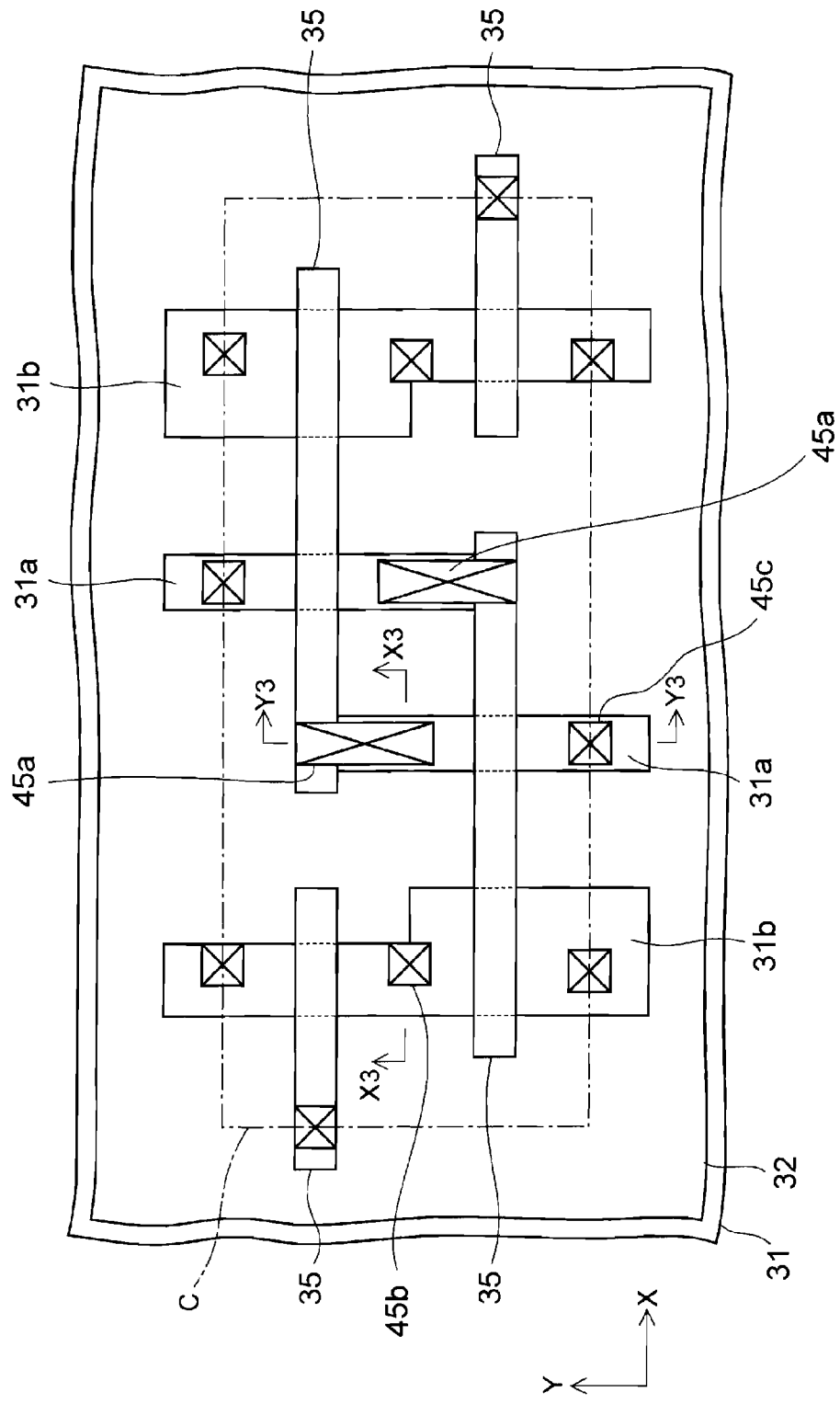

FIG. 6C is the plan view after completion of the above-described steps. Here, the second cross section in FIG. 5E corresponds to a cross section taken along an X3-X3 line in FIG. 6C and the first cross section in FIG. 5E corresponds to a cross section taken along a Y3-Y3 line in FIG. 6C.

In FIG. 6C, illustration of the cover insulating film 41 and the first insulating film 42 is omitted for the purpose of preventing complication of the drawing.

As illustrated in FIG. 6C, the first copper-containing plug 45a is formed to overlap with the gate electrode 35 and the first active region 31a, and is formed into a rectangular planar shape so as to correspond to the first hole 42a (see FIG. 5E). The extending direction of the first copper-containing plug 45a is parallel to the bit-line direction Y.

Meanwhile, each of the second copper-containing plug 45b and the third copper-containing plug 45c is formed into a square planar shape.

Figure 5F:
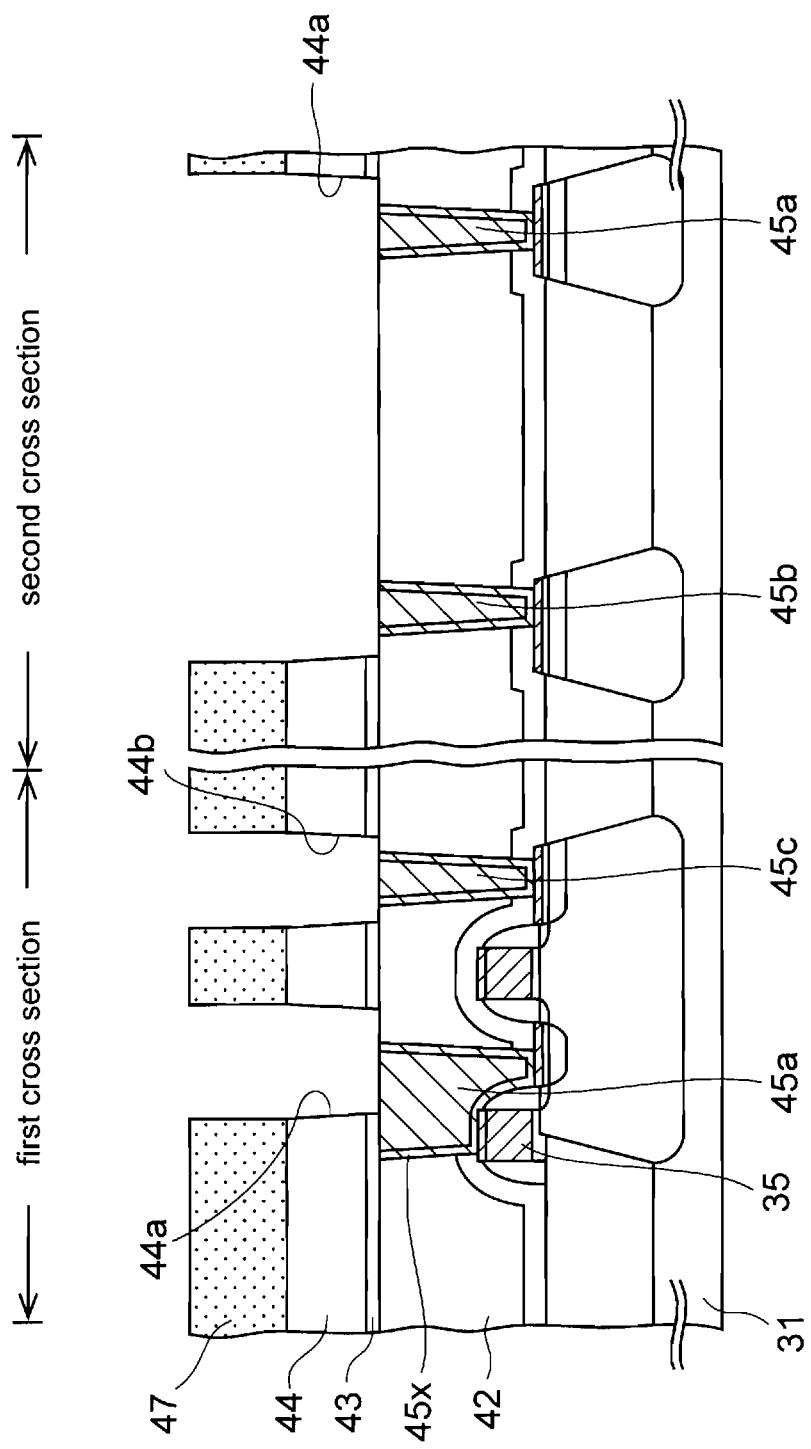

Next, steps to be carried out in order to obtain a cross-sectional structure illustrated in FIG. 5F will be described.

First, a silicon carbide film serving as a first copper diffusion prevention insulating film 43 is formed in a thickness of about 50 nm on the first insulating film 42 and on the first to third copper-containing plugs 45a to 45c by the CVD method.

Further, a silicon oxycarbide (SiOC) film is formed in a thickness of about 150 nm on the first copper diffusion prevention insulating film 43 by the CVD method, and the silicon oxycarbide film thus formed is used as a second insulating film 44.

Then, after forming a second resist patter 47 on the second insulating film 44, the first copper diffusion prevention insulating film 43 and the second insulating film 44 are dry etched using the second resist pattern 47 as a mask, thereby forming a first trench 44a and a second trench 44b in these insulating films.

The dry etching is performed by the RIE. In the RIE, etching gas containing either CHF-based gas or CF-based gas is used as etching gas for the second insulating film 44. Here, it is also possible to add inert gas such as argon gas or nitrogen gas to the etching gas.

Meanwhile, gas containing either $SO_2$ gas or $NF_3$ gas is used as etching gas for the first copper diffusion prevention insulating film 43. Since the first insulating film 42 functions as the etching stopper against this etching gas, the first insulating film 42 is prevented from being etched when forming the trenches 44a and 44b.

As illustrated in the second cross section, the first trench 44a thus formed extends from a position over the first copper-containing plug 45a to a position over the second copper-containing plug 45b. Meanwhile, as illustrated in the first cross section, the first trench 44a is formed away in the bit-line direction Y from a side surface 45x out of side surfaces of the first copper-containing plug 45a, which is located close to the gate electrode 35.

In the meantime, the second trench 44b is formed over the third copper-containing plug 45c and in the respective films 43 and 44 therearound.

Thereafter, the second resist pattern 47 is removed.

Next, steps to be carried out in order to obtain a cross-sectional structure illustrated in FIG. 5G will be described.

First, a tantalum film in a thickness of about 5 nm and a tantalum nitride film in a thickness of about 10 nm are formed in this order as a barrier metal film in the respective trenches 44a and 44b and on an upper surface of the second insulating film 44 by the sputtering method.

Further, a copper film is formed as a seed layer on this barrier metal film by the sputtering method and a copper plated film is formed by an electrolytic plating method while applying electricity to the seed layer, thereby completely burying the respective trenches 44a and 44b with the copper plated film.

Thereafter, the excessive copper plated film, the seed layer, and the barrier metal film on the second insulating film 44 are polished and removed by the CMP method. In this way, a first copper-containing interconnection 48a is formed in the first trench 44a and a copper-containing pad 48b is formed in the second trench 44b. The above-described method of forming the first copper-containing interconnection 48a and the copper-containing pad 48b in the process different from the process to form the respective copper-containing plugs 45a to 45c is referred to as a single damascene method.

Here, since the first trench 44a is formed away from the side surface 45x of the first copper-containing plug 45a, the first copper-containing interconnection 48a is formed to cover only a part of an upper surface of the first copper-containing plug 45a.

Meanwhile, the copper-containing pad 48b is formed on the third copper-containing plug 45c in a manner that the pad 48b is buried in the second insulating film 44 around the plug 45c.

FIG. 6D is the plan view after completion of the above-described steps. Here, the second cross section in FIG. 5G corresponds to a cross section taken along an X4-X4 line in FIG. 6D and the first cross section in FIG. 5G corresponds to a cross section taken along a Y4-Y4 line in FIG. 6D.

As illustrated in FIG. 6D, the first copper-containing interconnection 48a extends from the position over the first copper-containing plug 45a to the position over the second copper-containing plug 45b, and has a rectangular planar shape extending in the word-line direction X.

Further, the first copper-containing interconnection 48a is formed to recede from the side surface 45x of the first copper-containing plug 45a in a recession amount ΔY in the bit-line direction Y, and thereby covers only a part of the upper surface of the first copper-containing plug 45a.

Here, the planar shape of the first copper-containing interconnection 48a is not limited only to the above-mentioned rectangular shape as long as the first copper-containing interconnection 48a recedes from the side surface 45x and to expose the upper surface of the first copper-containing plug 45a as described previously. For example, the first copper-containing interconnection 48a may also be formed into an L-shape as similar to the first copper-containing interconnection 18a (see FIG. 1) of the preliminary matter.

Meanwhile, the planar shape of the copper-containing pad 48b is a rectangular shape extending in the word-line direction X. By applying this shape, the shape of the trench 44b (see FIG. 5F) is less affected by an optical proximity effect when forming the second trench 44b by photolithography for burying therein the copper-containing pad 48b as similar to the preliminary matter. Hence it is possible to suppress deformation of the shape of the copper-containing pad 48b.

Figure 5H:
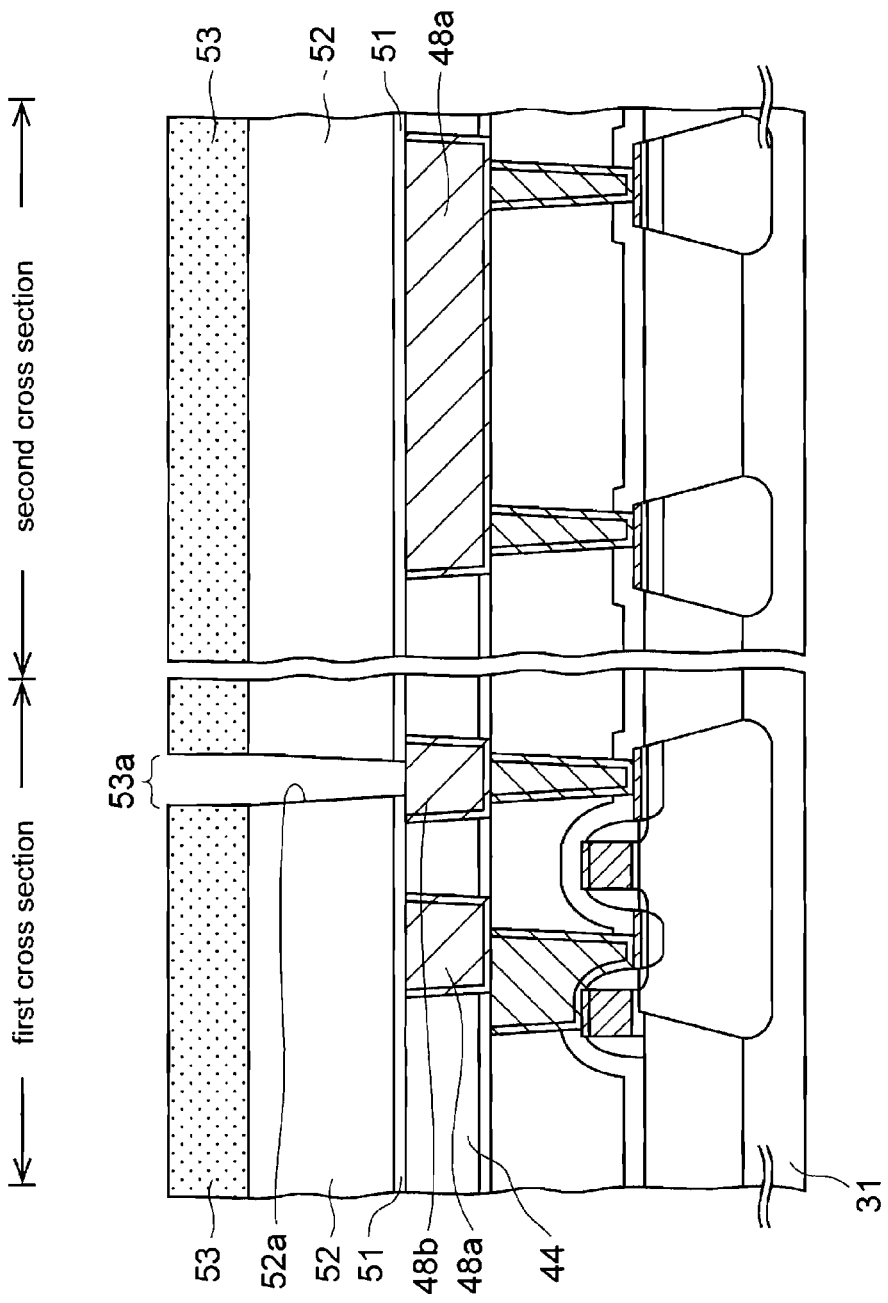

Subsequently, as illustrated in FIG. 5H, a second copper diffusion prevention insulating film 51 and a third insulating film 52 are formed in this order respectively on the second insulating film 44, the first copper-containing interconnection 48a, and the copper-containing pad 48b by the CVD method.

Of these insulating films, a silicon carbide film having a thickness of about 50 nm is formed as the second copper diffusion prevention insulating film 51 and a silicon oxycarbide film having a thickness of about 250 nm is formed as the third insulating film 52.

Thereafter, a third resist pattern 53 provided with a hole-shaped window 53a is formed on the third insulating film 52, and a fourth hole 52a is formed in the copper-containing pad 48b by dry etching the respective insulating films 51 and 52 using the third resist pattern 53 as a mask.

The dry etching is performed by the RIE. Either CHF-based gas or CF-based gas is used as etching gas for the third insulating film 52. It is also possible to add inert gas such as argon gas or nitrogen gas to the etching gas.

Meanwhile, gas containing either $SO_2$ gas or $NF_3$ gas is used as etching gas for the second copper diffusion prevention insulating film 51.

Thereafter, the third resist pattern 53 is removed.

Figure 5I:
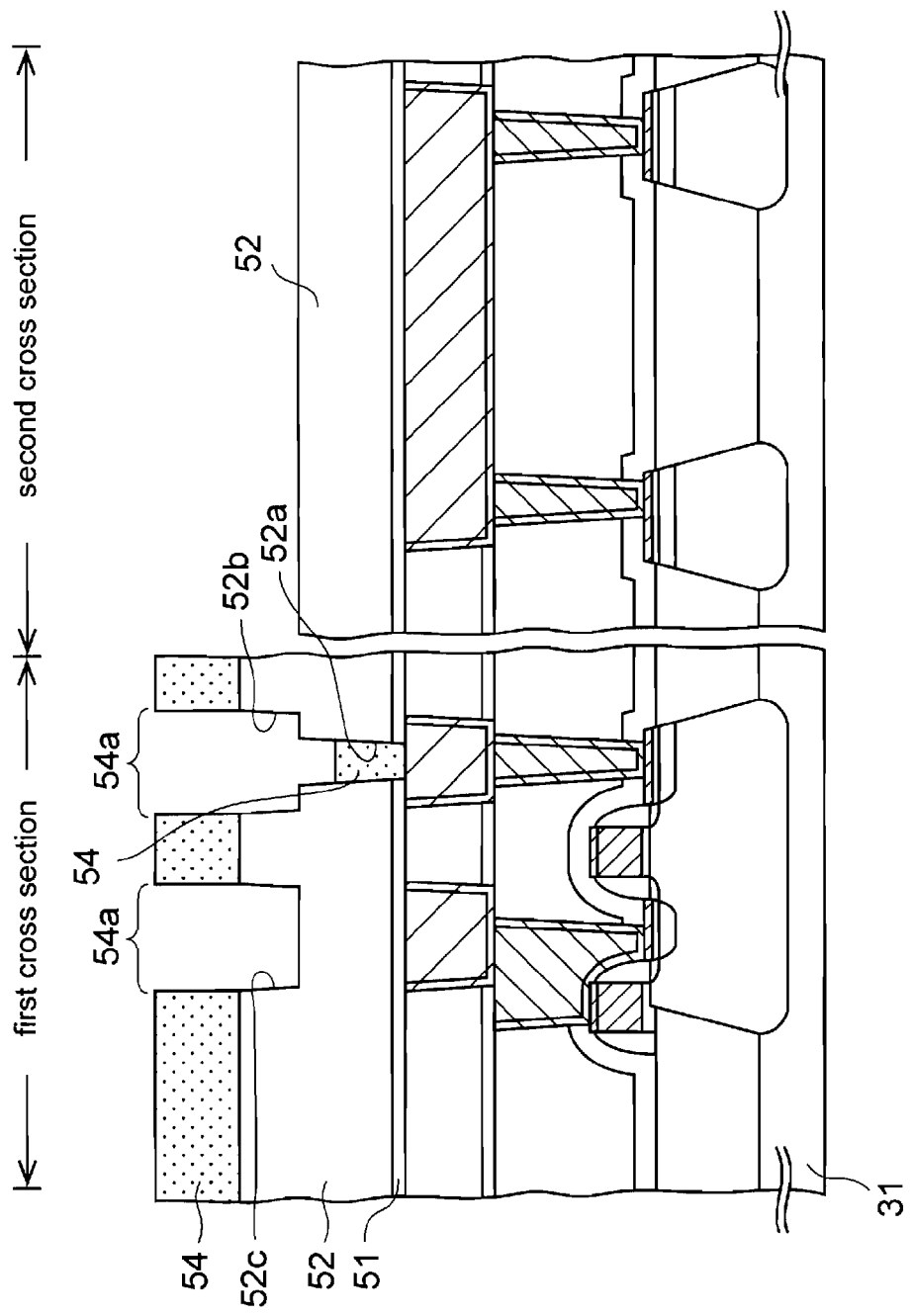

Subsequently, as illustrated in FIG. 5I, a photoresist is coated on the third insulating film 52 and in the fourth hole 52a, and a fourth resist pattern 54 provided with a window 54a having a wiring trench shape is formed by exposing and developing the photoresist. The fourth resist pattern 54 in the bottom portion of the fourth hole 52a is not removed by development, but is left in the hole 52a.

Then, the third insulating film 52 is dry etched to a halfway depth by the RIE using the fourth resist pattern 54 as a mask. In this way, a third trench 52b exposing the fourth hole 52a at a bottom and a fourth trench 52c located at a distance from the third trench 52b are formed on the third insulating film 52.

The etching gas containing either CHF-based gas or CF-based gas, or these gas with addition of inert gas such as argon gas or nitrogen gas is used for etching gas in this process.

Thereafter, the fourth resist pattern 54 is removed.

Next, steps to be carried out in order to obtain a cross-sectional structure illustrated in FIG. 5J will be described.

First, a tantalum film in a thickness of about 5 nm and a tantalum nitride film in a thickness of about 10 nm are formed in this order as a barrier metal film in the respective trenches 52b and 53c and the fourth hole 52a, and on an upper surface of the third insulating film 52 by the sputtering method.

Further, a copper film is formed as a seed layer on this barrier metal film by the sputtering method and a copper plated film is formed by the electrolytic plating method while applying electricity to the seed layer, thereby completely burying the respective trenches 52b and 52c as well as the fourth hole 52a with the copper plated film.

Thereafter, the excessive copper plated film, the seed layer, and the barrier metal film on the third insulating film 52 are polished and removed by the CMP method. In this way, a fourth copper-containing plug 55a penetrating the third insulating film 52 and a second copper-containing interconnection 55b are integrally formed in the third trench 52b and the fourth hole 52a, respectively.

Meanwhile, a third copper-containing interconnection 55c constituting a word line (WL) is formed in the fourth trench 52c.

The above-described method of integrally forming the fourth copper-containing interconnection 55a and the second copper-containing pad 55b is referred to as a dual damascene method.

The fourth copper-containing plug 55a is electrically connected to the third copper-containing plug 45c via the copper-containing pad 48b. Here, contact areas between the copper-containing pad 48b and the respective plugs 45c and 55a are ensured by connecting the respective plugs 45c and 55a to each other via the copper-containing pad 48b. Accordingly, it is possible to prevent an increase in the contact resistance between these plugs 45c and 55a as compared to the case of connecting the respective plugs 45c and 55a directly to each other without the copper-containing pad 48b interposed therebetween.

Thereafter, a silicon carbide film serving as a third copper diffusion prevention insulating film 57 is formed in a thickness of about 50 nm on respective upper surfaces of the third insulating film 52 and the copper-containing interconnections 55b and 55c by the CVD method.

FIG. 6E is the plan view after completion of the above-described steps. Here, the second cross section in FIG. 5J corresponds to a cross section taken along an X5-X5 line in FIG. 6E and the first cross section in FIG. 5J corresponds to a cross section taken along a Y5-Y5 line in FIG. 6E.

Figure 6F:
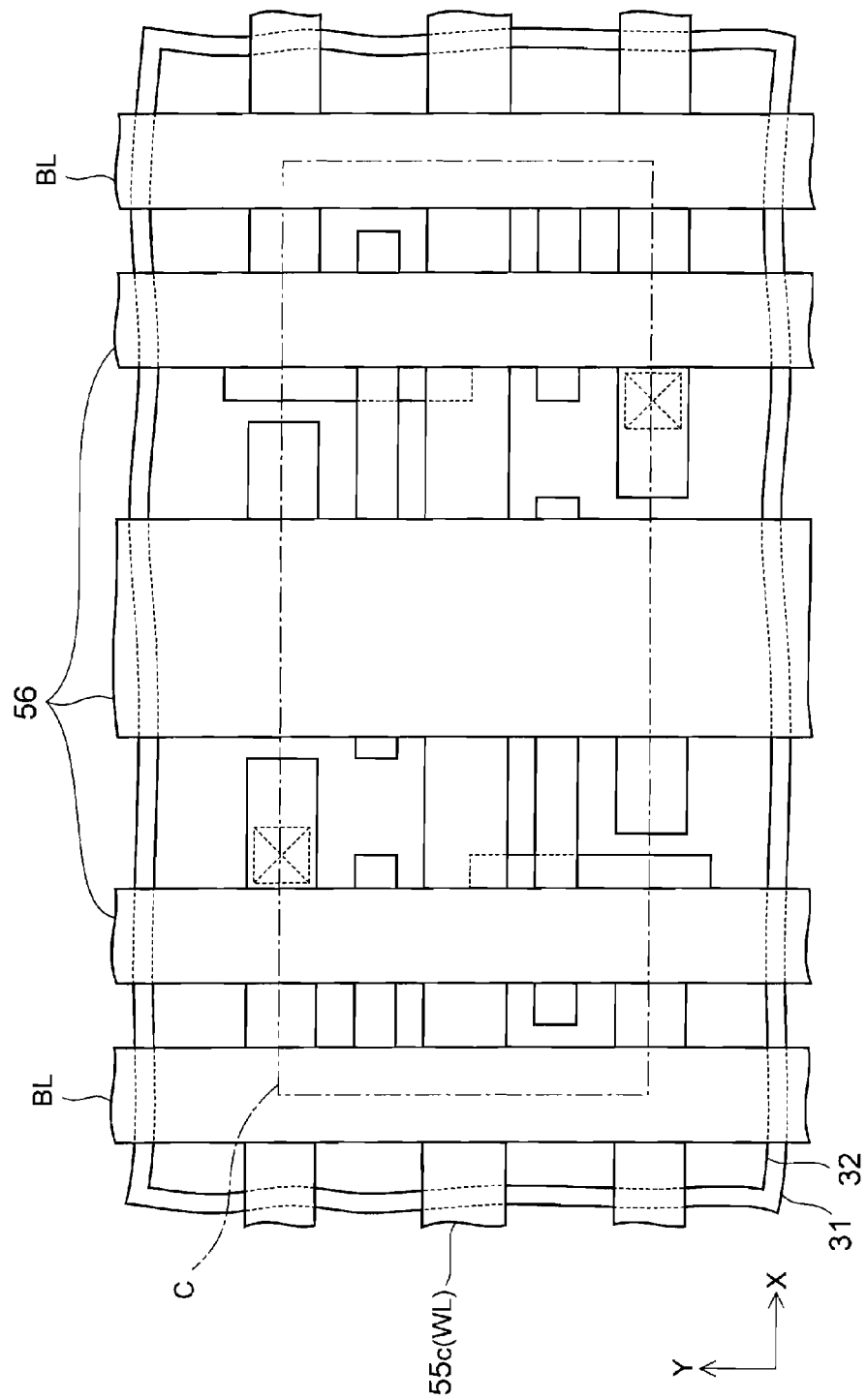

Thereafter, as illustrated in FIG. 6F, a bit line BL and a fourth copper-containing interconnection 56 are formed over the third copper-containing interconnection 55c by the dual damascene method.

In this way, a basic structure of the semiconductor device according to this embodiment is finished.

According to the above-described embodiment, as illustrated in the plan view of FIG. 6D, the first copper-containing interconnection 48a is formed to recede from the side surface 45x of the first copper-containing plug 45a in the bit-line direction Y to thereby cover only a part of the upper surface of the first copper-containing plug 45a with the first copper-containing interconnection 48a.

In this way, it is possible to provide a margin for the distance D between the first copper-containing interconnection 48a and the conductor pattern located in the same layer as the first copper-containing interconnection 48a, such as the copper-containing pad 48b, as compared to the case of forming the first copper-containing interconnection 48a into the L-shape as in the preliminary matter. Therefore, it is possible to downsize the memory cell C by reducing the distance D.

The inventor performed calculations in terms of the generation having the gate length of 22 nm, for example. In the example of the preliminary matter illustrated in FIG. 1, the length of the memory cell C in the word-line direction X is 0.5 µm while the length thereof in the bit-line direction Y is 0.264 µm. Hence the area of the memory cell C is 0.13 µm$^2$.

On the other hand, in the layout of this embodiment illustrated in FIG. 6D, the length of the memory cell C in the word-line direction X is 0.562 µm while the length thereof in the bit-line direction Y is 0.184 µm. Hence, the area of the memory cell C is 0.10 µm$^2$. Here, the reason why the length in the word-line direction X of the memory cell C of the embodiment is longer than the length in the preliminary matter is that a length A in the word-line direction X of another copper-containing pad 48c is increased in order to ensure to the area of the copper-containing pad 48c which is formed on the same layer as the copper-containing pad 48b. Another reason is that a clearance B is intended to be ensured between the copper-containing pad 48c and still another copper-containing pad 48d.

In this manner, according to this embodiment, it is possible to reduce the area of the memory cell C by about 23% less than the relevant area in the case of the preliminary matter. Thus it is possible to confirm that the embodiment can contribute to reduction in the cell size of the SRAM.

Moreover, by forming the first copper-containing interconnection 48a receding from the side surface 45x of the first copper-containing plug 45a in the bit-line direction, the planar shape of the first copper-containing interconnection 48a is formed into the simple rectangular shape extending in the word-line direction.

In this way, it is possible to simplify the OPC processing to be performed on an exposure mask when exposing the second resist pattern 47 (see FIG. 5F) as compared to the case of forming the first copper-containing interconnection 48a into the L-shape as in the preliminary matter. Hence it is possible to design the exposure mask in a shorter period of time.

Furthermore, in this embodiment, the copper-containing plugs having lower resistance than that of the tungsten plugs are formed as the respective plugs 45a to 45c to be connected to the respective active regions 31a and 31b. Accordingly, as illustrated in FIG. 4, the resistance of the respective copper-contain plugs 45a to 45c can be maintained at about 1/10 or less of the on resistance of the MOS transistor, even when the MOS transistor comes to have a gate length of 45 nm or below with the progress of generations. In this way, it is possible to downsize the respective transistors $TR_{drive}$, $TR_{access}$, and $TR_{load}$ while retaining the characteristics of these transistors, and thereby to further downsize the memory cell of the SRAM.

Meanwhile, since the first copper-containing plug 45a has smaller resistance as compared to the tungsten plug, it is possible to maintain the contact resistance between the first copper-containing plug 45a and the copper-containing interconnection 48a even when only a part of the upper surface of the first copper-containing plug 45a is covered with the copper-containing interconnection 48a.

Second Embodiment

FIGS. 7A to 7F are cross-sectional views during manufacture of a semiconductor device according to this embodiment, and FIGS. 8A to 8D are plan views thereof. In FIGS. 7A to 7F, the same constituents as those in the first embodiment are designated by the same reference numerals as the first embodiment, and description thereof will be omitted in the following.

In the first embodiment, the first copper-containing interconnection 48a is formed by the single damascene method as described with reference to FIG. 5G In contrast, in this embodiment, the corresponding copper-containing interconnection is formed by the dual damascene method.

Figure 7A:
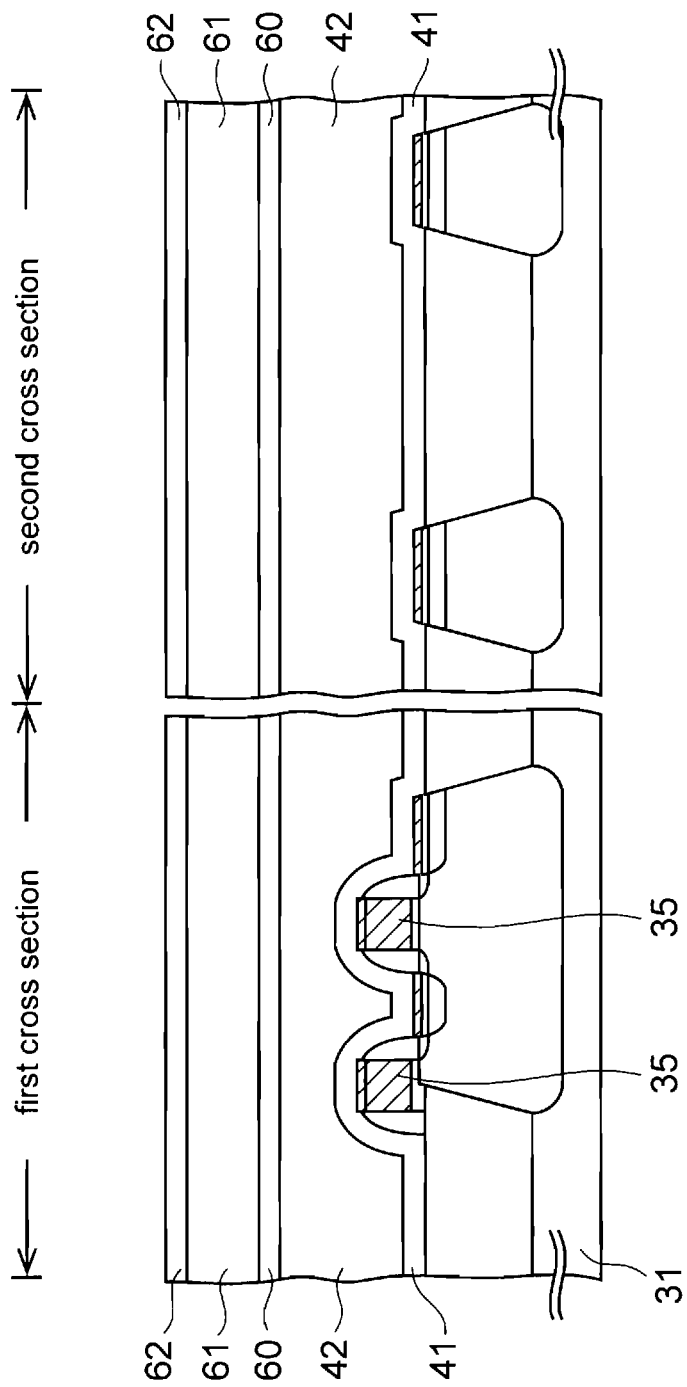
FIGS. 7A to 7F are cross-sectional views during manufacture of a semiconductor device according to a second embodiment.

To manufacture the semiconductor device according to this embodiment, the steps in the first embodiment as illustrated in FIGS. 5A to 5C are firstly executed, and then a silicon carbide film serving as an etching stopper film 60 is formed in a thickness of about 50 nm on the first insulating film 42 by the CVD method as illustrated in FIG. 7A.

Here, the etching stopper film 60 is not limited only to the silicon carbide film. It is also possible to form a silicon nitride film as the etching stopper film 60 instead.

Moreover, a second insulating film 61 and an antireflection insulating film 62 are formed in this order on this etching stopper film 60. The second insulating film 61 is a silicon oxide film in a thickness of about 150 nm which is formed by the CVD method, for example. Meanwhile, as for the antireflection insulating film 62, a silicon nitride film is formed in a thickness of about 30 nm by the CVD method.

Figure 8A:
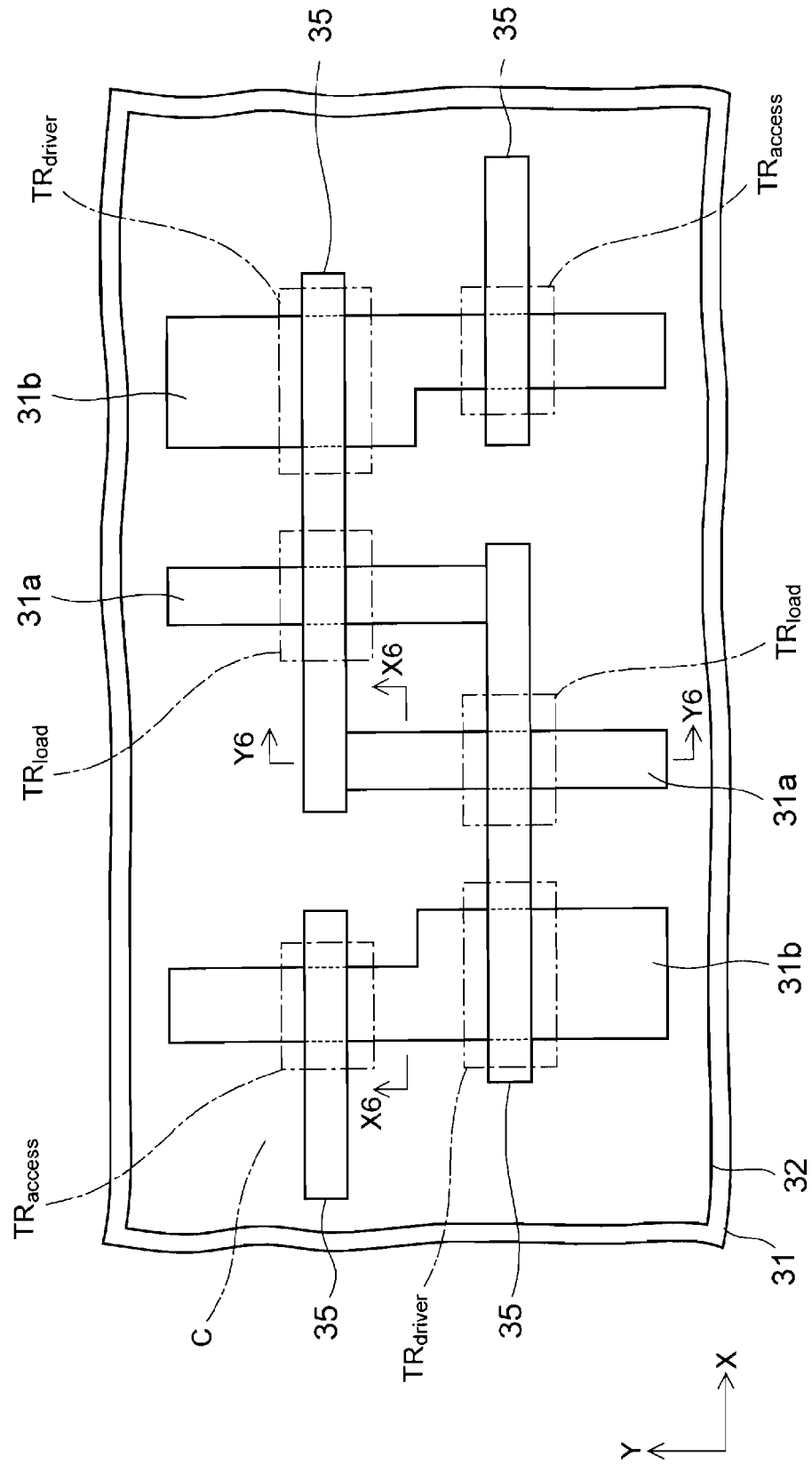

FIG. 8A is the plan view after completion of the above-described steps. Here, the second cross section in FIG. 7A corresponds to a cross section taken along an X6-X6 line in FIG. 8A and the first cross section in FIG. 7A corresponds to a cross section taken along a Y6-Y6 line in FIG. 8A.

Here, the respective insulating films 41, 42, and 60 to 62 are omitted in FIG. 8A in order to facilitate the understanding of planar layouts of the first and second active regions 31a and 31b as well as the gate electrodes 35.

As illustrated in FIG. 8A, the driver transistors $TR_{drive}$, the access transistors $TR_{access}$, and the load transistors $TR_{load}$ are formed as similar to the first embodiment at the portions where the gate electrodes 35 overlap with the respective active regions 31a and 31b.

Figure 7B:
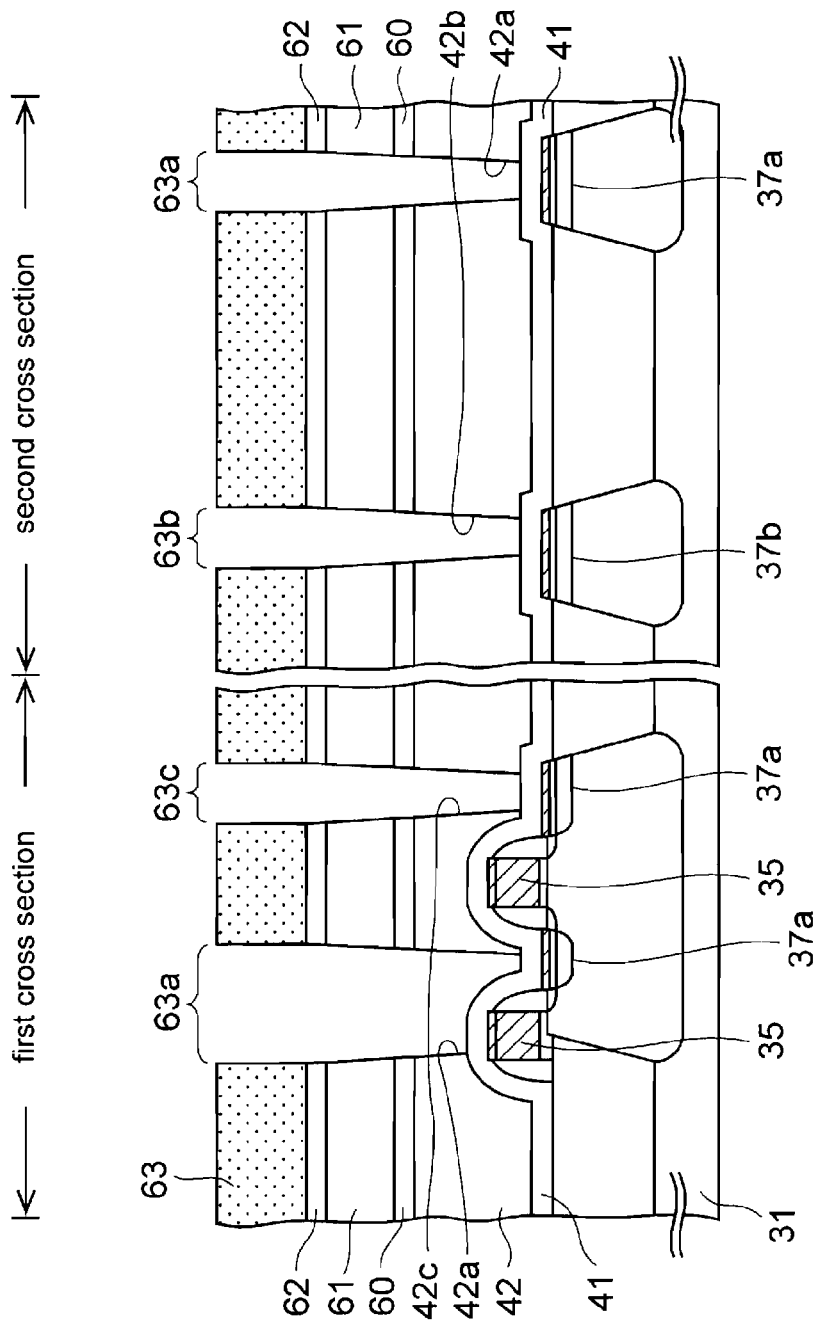

Subsequently, as illustrated in FIG. 7B, a first resist pattern 63 provided with hole-shaped windows 63a to 63c is formed on the antireflection insulating film 62.

The first resist pattern 63 is used as a mask for etching the respective insulating films 42 and 60 to 62. The first to third holes 42a to 42c are formed in these insulating films 42 and 60 to 62 by the RIE.

The etching gas used in the RIE is not particularly limited. For example, gas containing $SO_2$ gas or $NF_3$ gas is used as the etching gas for the etching stopper film 60.

Meanwhile, the mixed gas of $C_2F_6$ gas and $CH_3$ gas is used as the etching gas for the first insulating film 42 and the second insulating film 61, for example. When using this etching gas, the etching rate of the cover insulating film 41 is lower than that of the first insulating film 42. Accordingly, this etching process stops on the upper surface of the cover insulating film 41.

As illustrated in the first cross section, among the respective holes thus formed, both of the first hole 42a and the third hole 42c are formed on the p-type source-drain region 37a and the first hole 42a is formed to further overlap with the gate electrode 35.

Meanwhile, as illustrated in the second cross section, the second hole 42b is formed on the n-type source-drain region 37b.

Figure 7C:
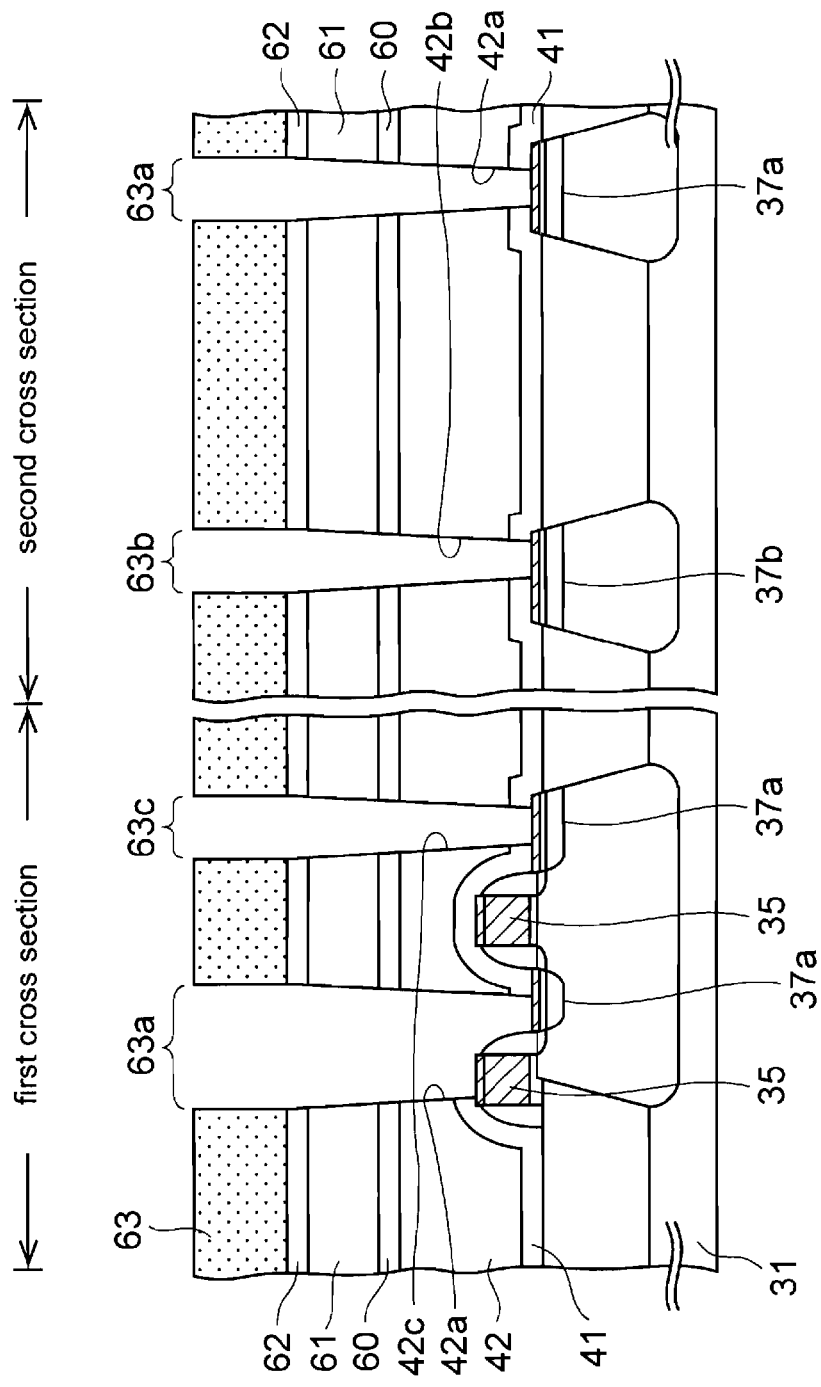

Subsequently, as illustrated in FIG. 7C, the cover insulating film 41 below the respective contact holes 42a to 42c is dry etched and removed by performing the RIE while changing the etching gas into the $CF_4$ gas.

Thereafter, the first resist pattern 63 is removed.

Figure 7D:
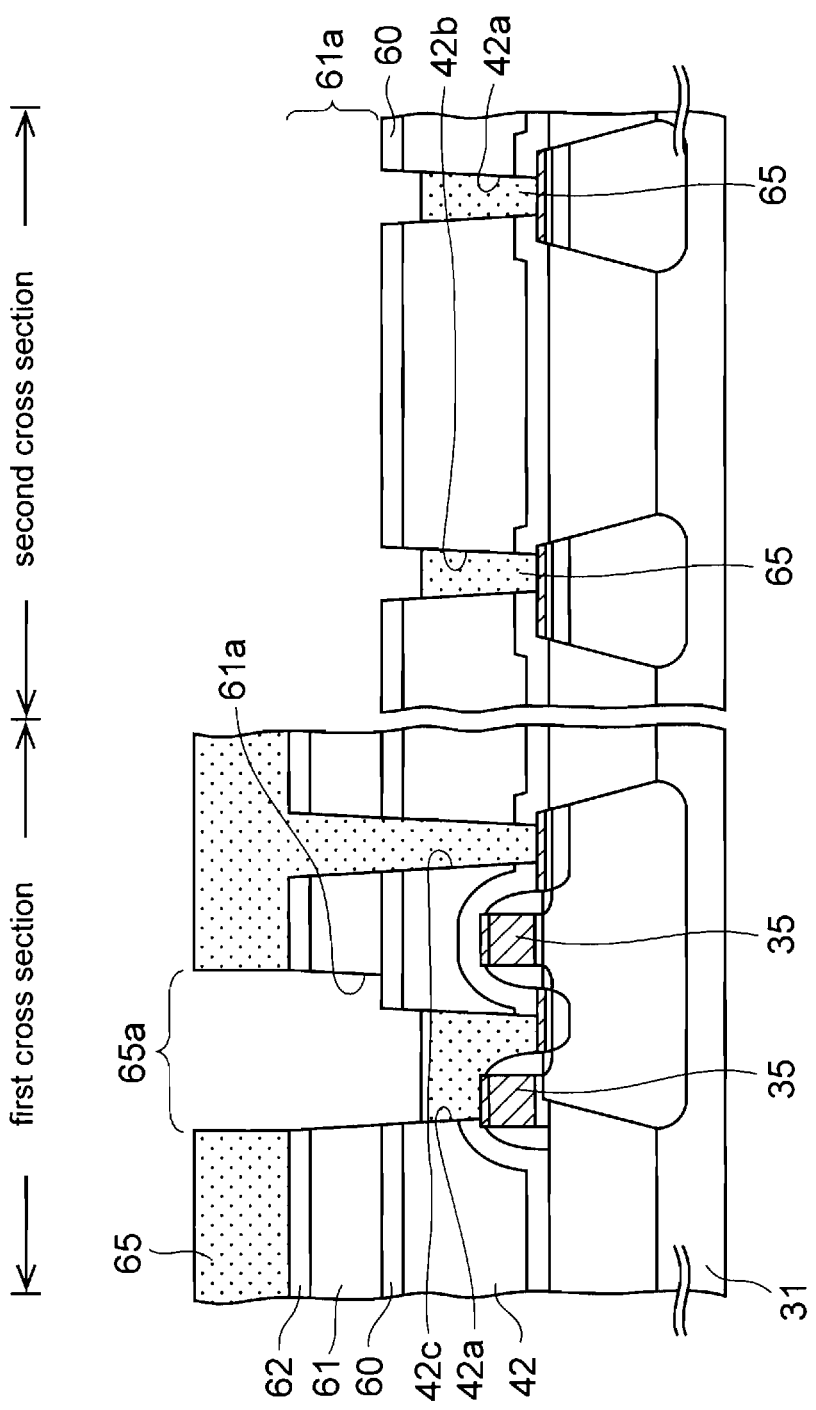

Next, as illustrated in FIG. 7D, a photoresist is coated again on the antireflection insulating film 62, and then is developed by exposure to form a second resist pattern 65 provided with a window 65a having a wiring trench shape and overlapping with the first hole 42a.

The second resist pattern 65 in the bottom portions of the first hole 42a and the second hole 42b is not removed by development but is left in these holes 42a and 42b. Meanwhile, the third hole 42c is completely filled with the second resist pattern 65.

Then, the antireflection insulating film 62 and the second insulating film 61 are dry etched by the RIE while using the second resist pattern 65 as a mask, thereby forming a first trench 61a in these insulating films 61 and 62.

The etching gas with which the etching rate of the etching stopper film 60 is lower than that of the second insulating film 61, i.e., the mixed gas of $C_2F_6$ gas and $CH_3$ gas, for example, is used in this dry etching process. In this way, the etching stops on the etching stopper film 60 and the first insulating film 42 is prevented from being etched.

Meanwhile, the first trench 61a thus formed extends from a position over the first hole 42a to a position over the second hole 42b as illustrated in the second cross section.

Thereafter, the second resist pattern 65 is removed.

Next, steps to be carried out in order to obtain a cross-sectional structure illustrated in FIG. 7E will be described.

First, a tantalum film and a tantalum nitride film are formed in this order as a barrier metal film in the respective holes 42a to 42c as well as the first trench 61a and on an upper surface of the antireflection insulating film 62 by the sputtering method. Although the film thickness of the barrier metal film is not particularly limited, the tantalum film is set to about 5 nm and the tantalum nitride film is set to about 10 nm in this embodiment.

Then, a copper film is formed as a seed layer on this barrier metal film by the sputtering method and a copper plated film is formed using the seed layer as a power feeding layer, thereby completely burying the respective holes 42a to 42c and the first trench 61a with the copper plated film.

Thereafter, the excessive copper plated film, the seed layer, and the barrier metal film on the antireflection insulating film 62 are polished and removed by the CMP method.

In this way, first to third copper-containing plugs 70a to 70c are formed in the respective holes 42a to 42c by the dual damascene method. Moreover, in this dual damascene method, a first copper-containing interconnection 70 is formed in the first trench 61a over the etching stopper film 60.

The first copper-containing interconnection 70 formed by the dual damascene method is formed integrally with the first copper-containing plug 70a and the second copper-containing plug 70b. Meanwhile, the third copper-containing plug 70c penetrates the first insulating film 42 and the second insulating film 61 and is electrically connected to the source-drain region 37a.

Figure 7E:
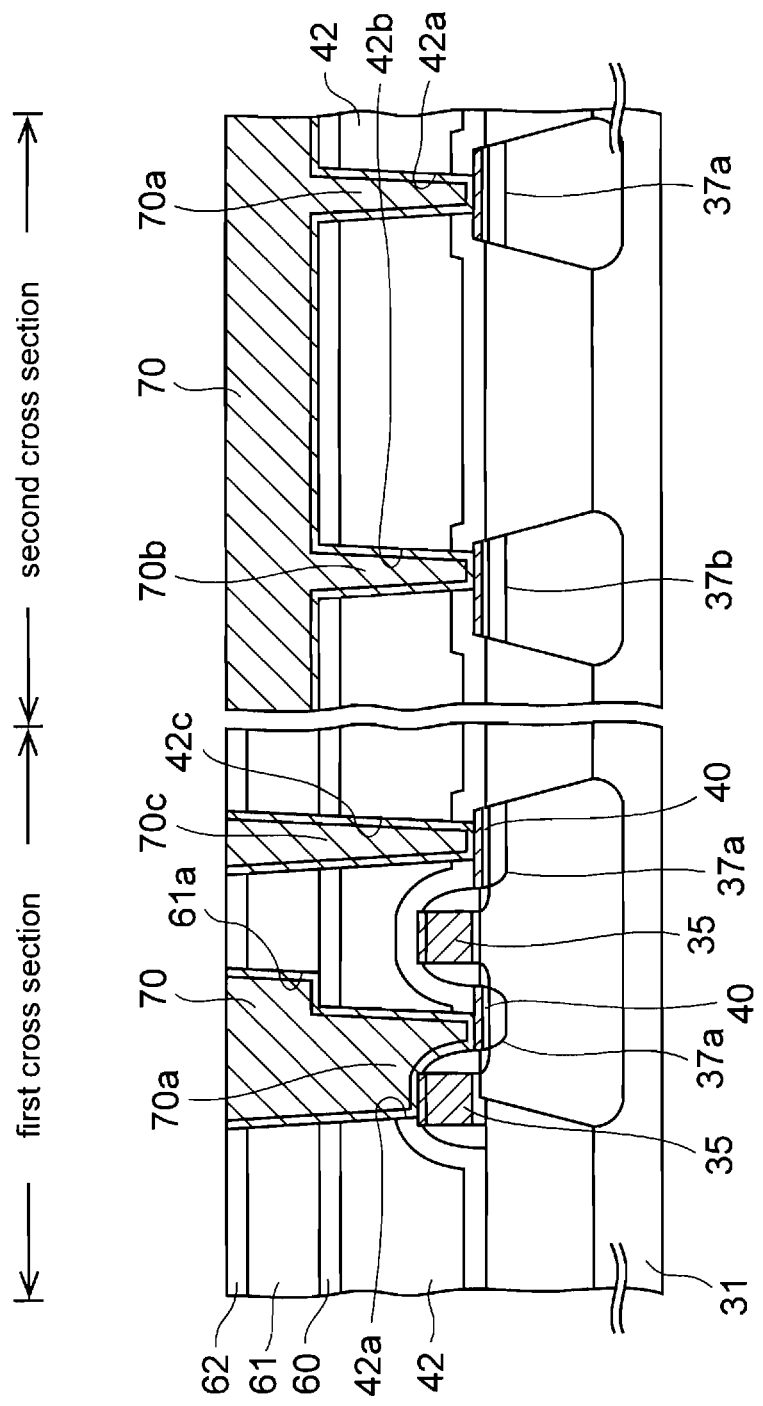
Figure 8B:
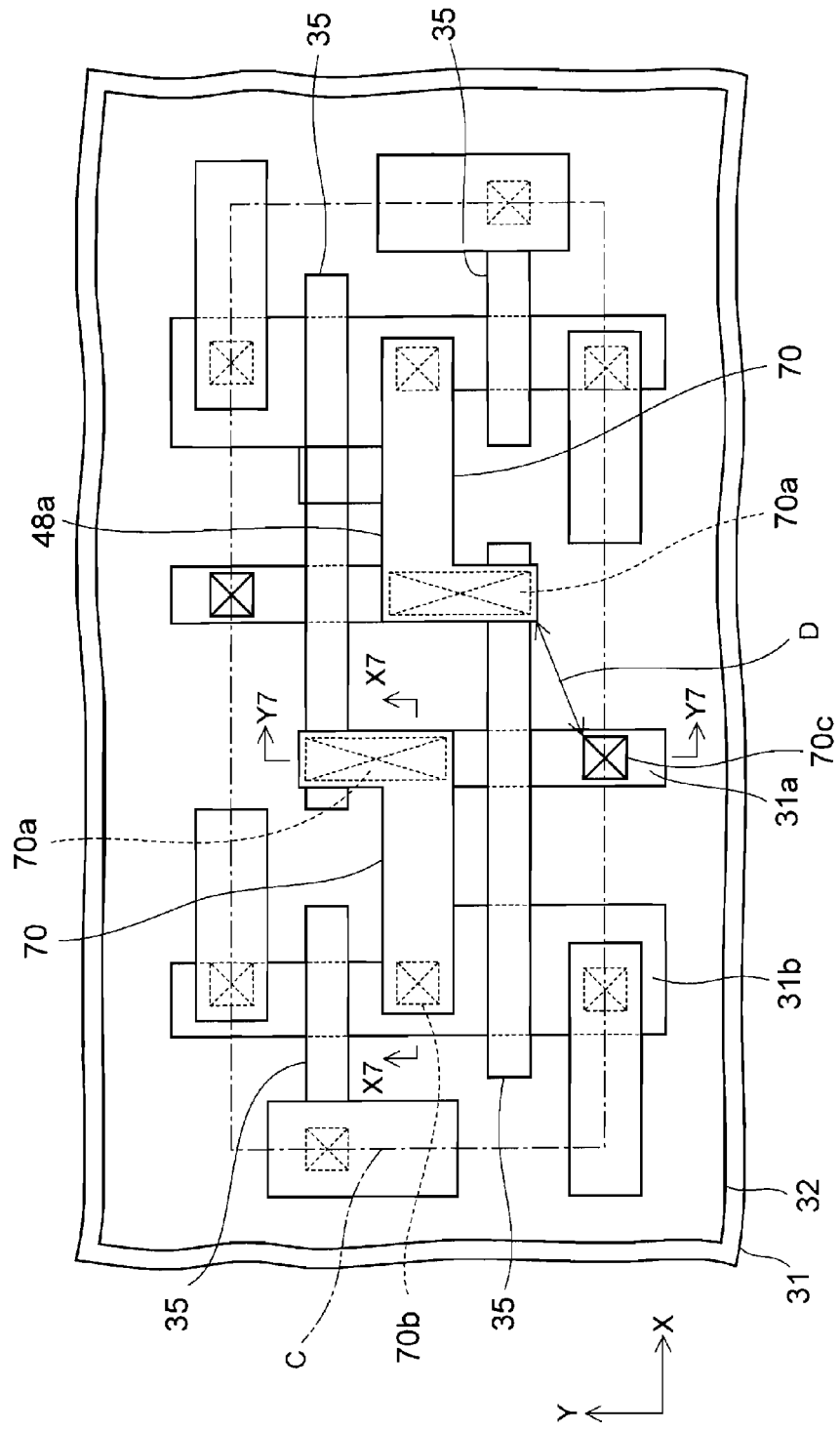

FIG. 8B is the plan view after completion of the above-described steps. Here, the second cross section in FIG. 7E corresponds to a cross section taken along an X7-X7 line in FIG. 8B and the first cross section in FIG. 7E corresponds to a cross section taken along a Y7-Y7 line in FIG. 8B.

As illustrated in FIG. 8B, the first copper-containing plug 70a has a rectangular planar shape so as to correspond to the first hole 42a (see FIG. 7E).

Meanwhile, the first copper-containing interconnection 70 has an L-shaped planar shape which is formed to cover the above-described first copper-containing plug 70a.

Even when the first copper-containing interconnection 70 is formed into the L-shape, the copper-containing pad 48b (see FIG. 6D) is not formed on the third copper-containing plug 70c in this embodiment unlike the first embodiment, so that it is possible to gain a space by omitting the copper-containing pad 48b. Accordingly, it is possible to reduce the length of the memory cell C in the bit-line direction Y by curtailing the distance D between the first copper-containing interconnection 70 and the third copper-containing plug 70c, and thereby to achieve reduction in the cell size.

Figure 5J:
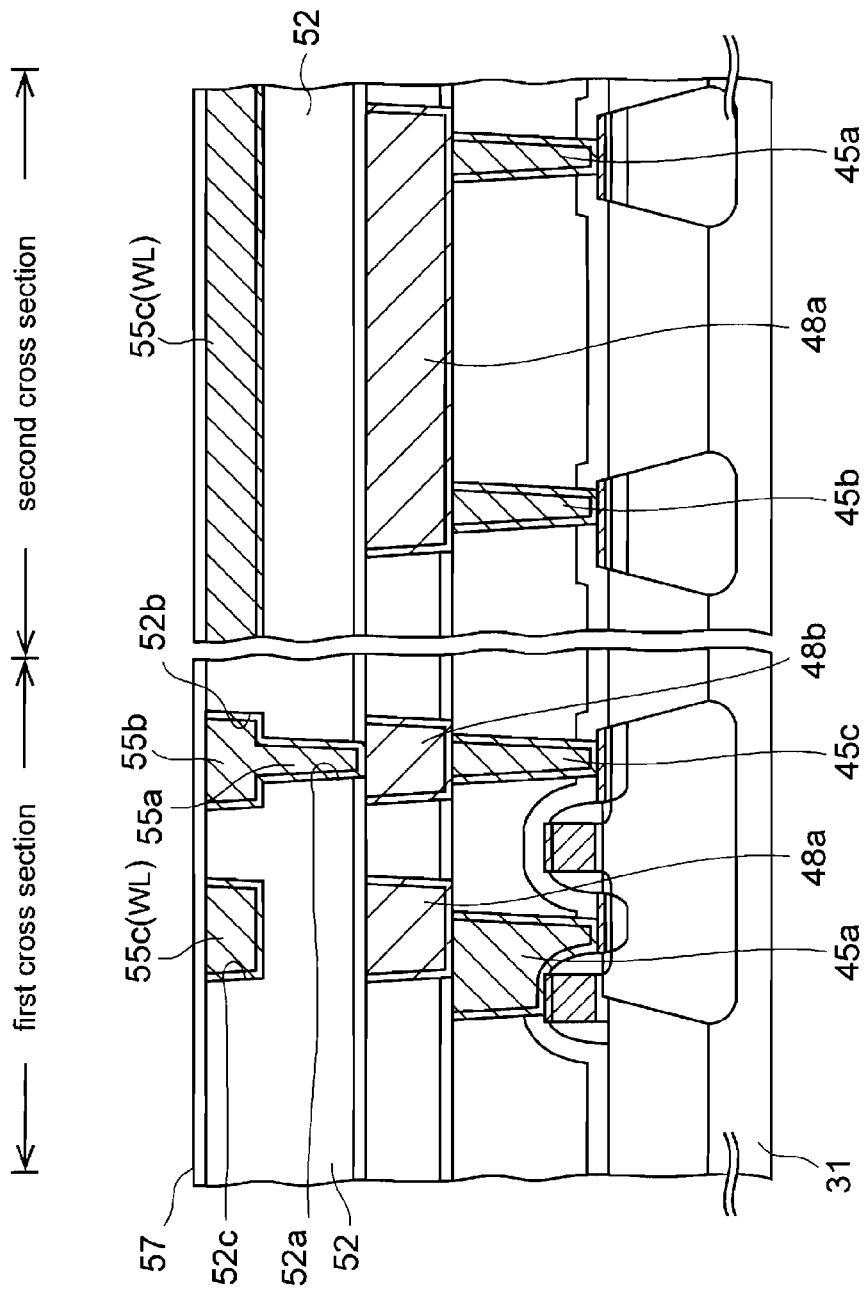
Figure 7F:
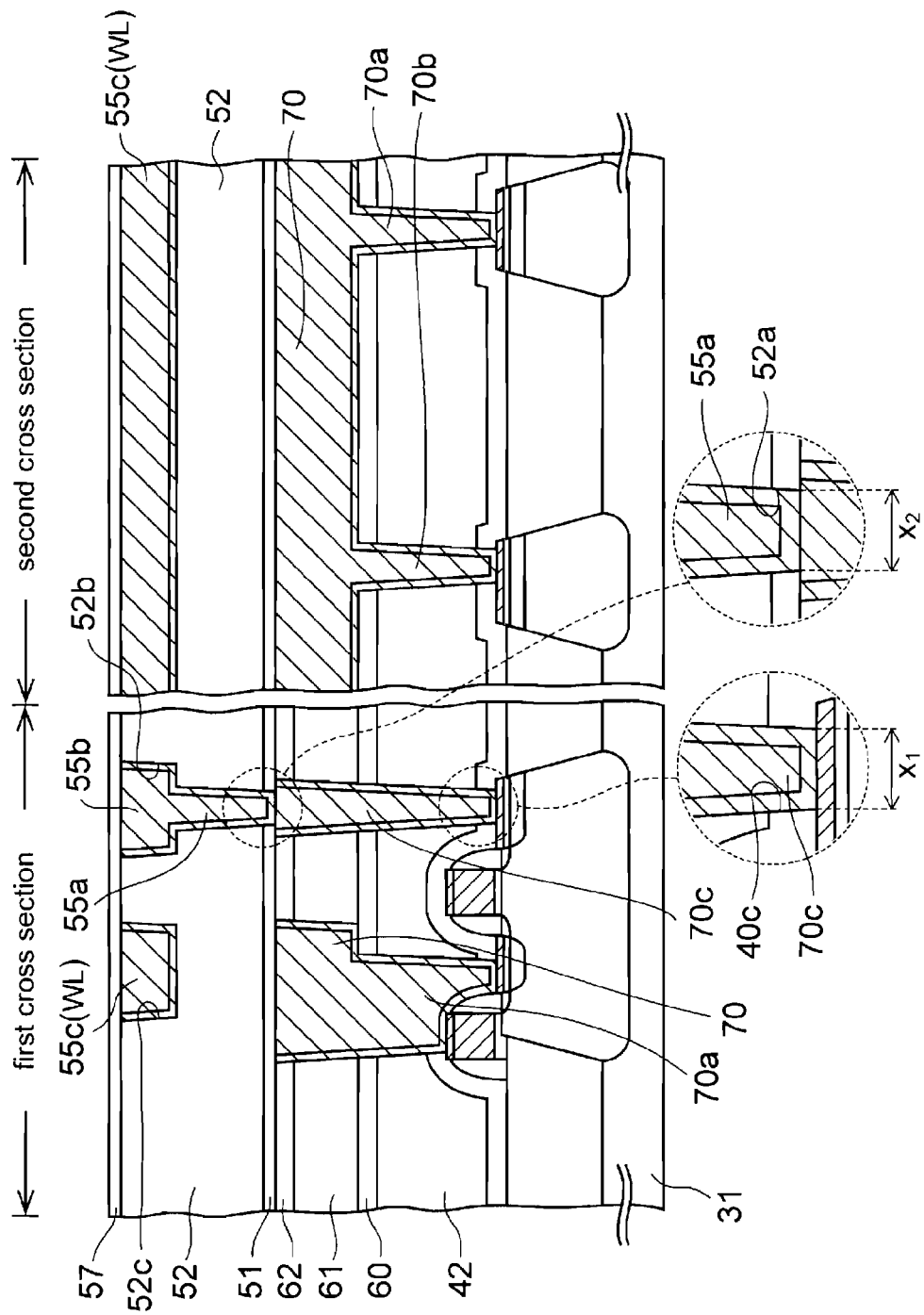

Next, as illustrated in FIG. 7F, the third insulating film 52, the third copper-containing interconnection 55c constituting the word line (WL), and the like are formed by carrying out the steps in FIGS. 5H to 5J as described in the first embodiment.

Figure 8C:
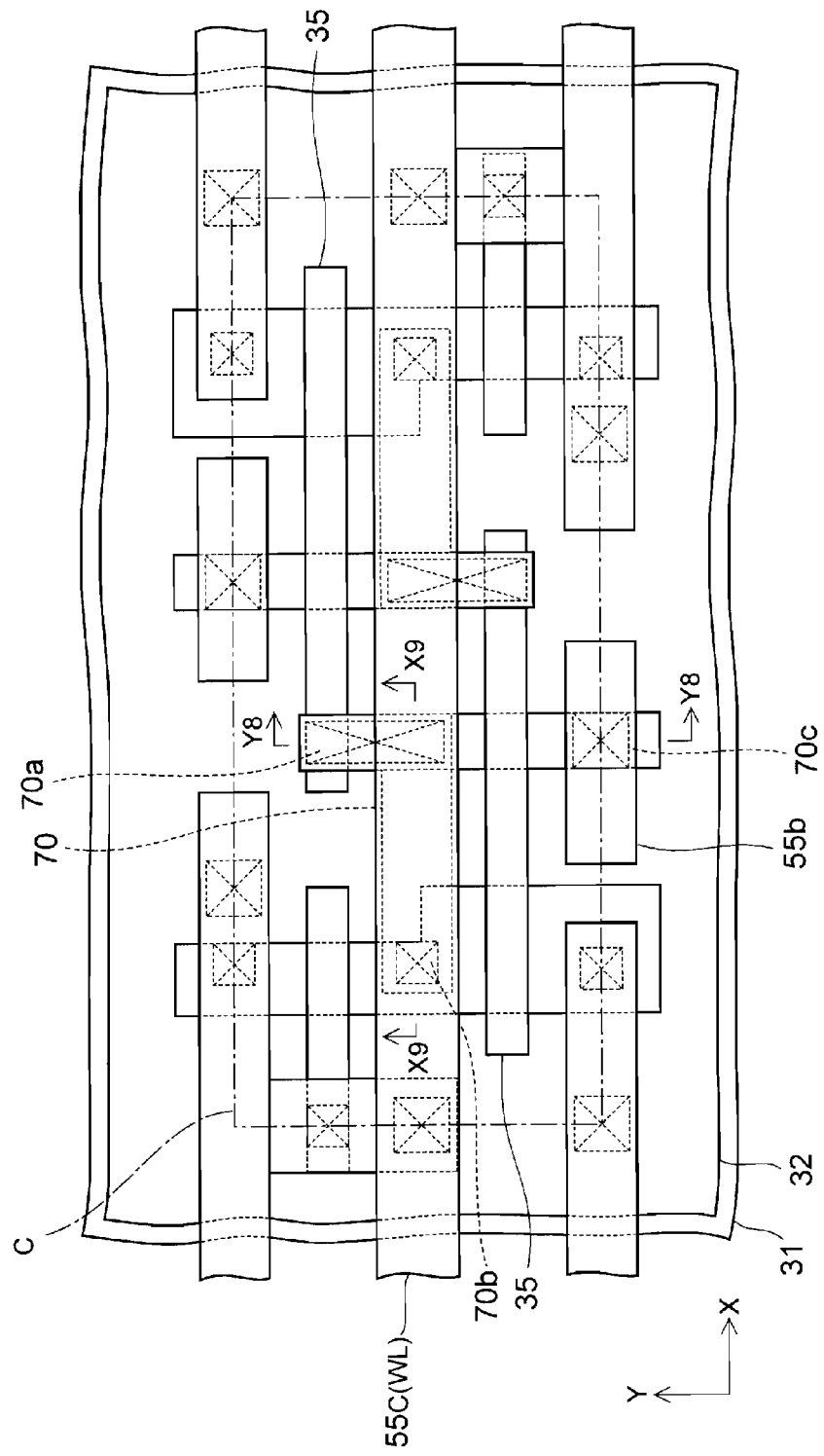

FIG. 8C is the plan view after completion of the above-described steps. Here, the second cross section in FIG. 7F corresponds to a cross section taken along an X8-X8 line in FIG. 8C and the first cross section in FIG. 7F corresponds to a cross section taken along a Y8-Y8 line in FIG. 8C.

Thereafter, as illustrated in FIG. 8D, the bit line BL and the fourth copper-containing interconnection 56 are formed over the third copper-containing interconnection 55c by the dual damascene method as similar to the first embodiment.

In this way, a basic structure of the semiconductor device according to this embodiment is finished.

According to this embodiment, as described with reference to FIG. 7E, the third copper-containing plug 70c is formed simultaneously with formation of the first copper-containing interconnection 70 by use of the dual damascene method.

The third copper-containing plug 70c formed by the damascene method is formed to penetrate the second insulating film 61. Therefore, it is not necessary to provide the copper-containing pad 48b (see FIG. 5J) for establishing contact with the third copper-containing plug 70c and the fourth copper-containing plug 55a (see FIG. 7F).

Accordingly, as described with reference to FIG. 8B, it is possible to arrange the first copper-containing interconnection 70 with wide margin by omitting the copper-containing pad 48b, and to reduce the cell size by curtailing the distance D between the first copper-containing interconnection 70 and the third copper-containing plug 70c.

Moreover, since the dual damascene method can reduce the number of steps as compared to the single damascene method, this embodiment can further simplify the process as compared to the first embodiment.

However, as illustrated in FIG. 7F, when the third copper-containing plug 70c is formed by the dual damascene method, the depth of the third hole 42c becomes deeper than that in the first embodiment by the thickness of the second insulating film 61. Hence an aspect ratio of the third hole 42c is increased as compared to the first embodiment.

Such an increase in the aspect ratio may cause deterioration in burying performance of the barrier metal film, the copper plated film, and the like in the third hole 42c. Accordingly, it may be necessary to introduce a novel film deposition apparatus or a novel process which can improve the burying performance.

To avoid this problem, it is preferable to make a diameter $x_1$ of the third hold 42c as large as possible and to suppress the increase in the aspect ratio of the third hole 42c. The same applies to a third embodiment to be described later.

The degree of the increase in the size of the diameter $x_1$ is not particularly limited. However, it is preferable to make the diameter $x_1$ larger than a diameter $x_2$ of the fourth hole 52a, for example.

However, if the diameter $x_1$ is made too large, there is a risk of affecting reduction in the cell size. Accordingly, an upper limit of the diameter $x_1$ is preferably set about 1.2 times as large as the diameter $x_2$.

Here, when the respective holes 42c and 52a have tapered cross-sectional shapes as illustrated in FIG. 7F, the diameters $x_1$ and $x_2$ of these holes 42c and 52a at bottom surfaces of the respective plugs 70c and 55a are compared with each other.

By the way, in this embodiment, the etching stopper film 60 is formed between the first insulating film 42 and the second insulating film 61. The etching stopper film 60 plays a role in preventing the first insulating film 42 from being etched when the first trench 61a is formed by etching in the step illustrated in FIG. 7D.

Figure 9A:
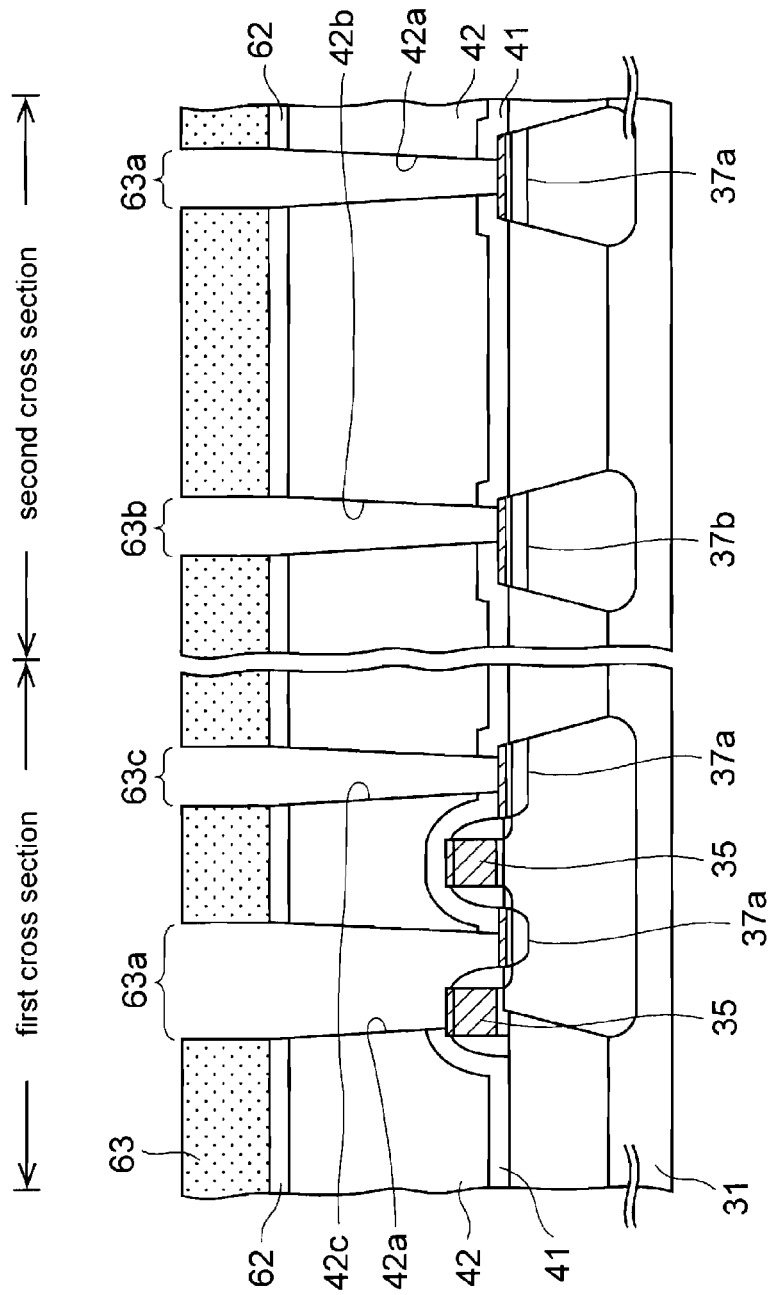
FIGS. 9A to 9C are cross-sectional views during manufacture of a semiconductor device according to a comparative example.
Figure 9B:
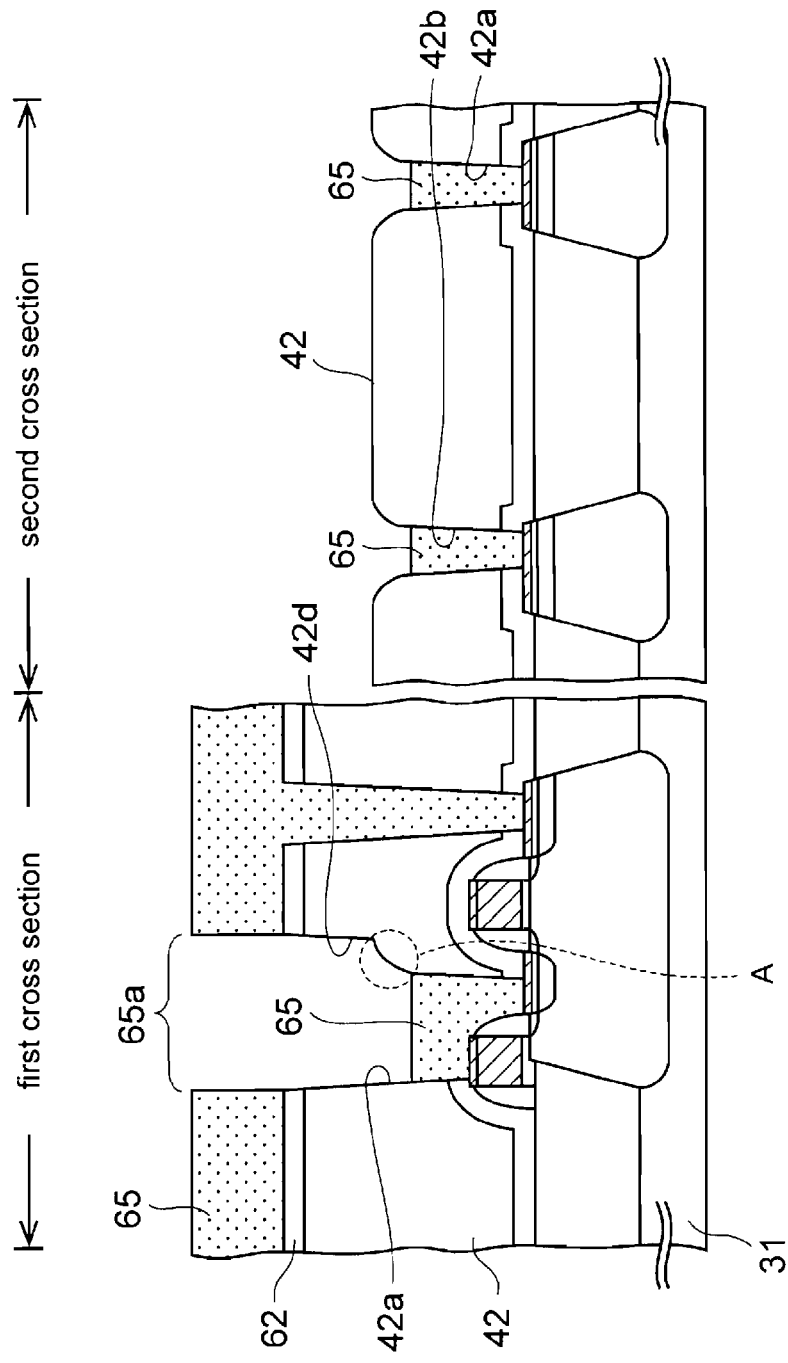
Figure 9C:
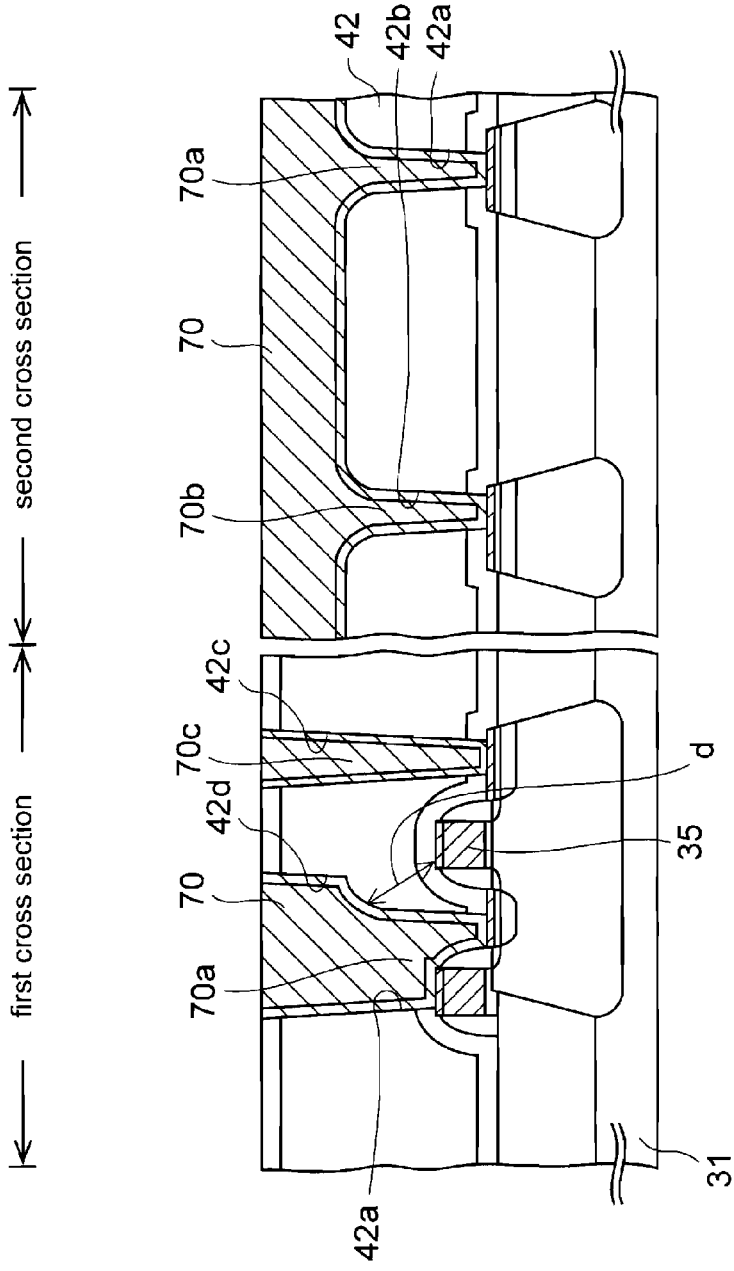

FIGS. 9A to 9C are cross-sectional views during manufacture of a semiconductor device according to a comparative example for explaining an advantage obtained by the prevention of etching the first insulating film 42 in this manner. In FIGS. 9A to 9C, the same constituents as those in this embodiment will be designated by the same reference numerals as those in this embodiment and description thereof will be omitted in the following.

As illustrated in FIG. 9A, this comparative example omits the etching stopper film 60 and the second insulating film 61 from this embodiment. Then, as similar to the steps described above in conjunction with FIGS. 7B and 7C, the cover insulating film 41 and the first insulating film 42 are dry etched using the first resist pattern 63 as the mask, whereby the first to third holes 42a to 42c are formed on these insulating films 41 and 42.

After removing the first resist pattern 63, the second resist pattern 65 is formed on the antireflection insulating film 62 similarly to this embodiment as illustrated in FIG. 9B.

Then, the first insulating film 42 is dry etched to a midway depth using the second resist pattern 65 as the mask, thereby forming the first trench 42d in the first insulating film 42.

At this time, a bottom surface A of the first trench 42d is not covered with the second resist pattern 65, and is therefore formed into a chamfered shape as illustrated in FIG. 9B due to exposure to an etching atmosphere.

Subsequently, after removing the second resist pattern 65, the first to third copper-containing plugs 70a to 70c are formed in the first to third holes 42a to 42c by the dual damascene method as illustrated in FIG. 9C, and the first copper-containing interconnection 70 is formed in the first trench 42d.

According to this comparative example, since the bottom surface A of the first groove 42d is chambered as illustrated in FIG. 9B, the distance d between the gate electrode 35 and the first copper-containing interconnection 70 becomes shorter as illustrated in FIG. 9C, thereby incurring a problem of reduction in voltage resistance between the first copper-containing interconnection 70 and the gate electrode 35.

On the other hand, in the present embodiment, since bottom surface of the first groove 61a is protected by the etching stopper film as illustrated in FIG. 7D, it is possible to prevent the bottom surface of the first trench 61a from being etched and to avoid reduction in the voltage resistance between the first copper-containing interconnection 70 and the gate electrode 35.

Third Embodiment

In this embodiment, the first copper-containing interconnection 70 is formed by the dual damascene method as similar to the second embodiment. However, as will be described later, a stacked structure of the insulating films for burying the fist copper-containing interconnection 70 of this embodiment is different from the second embodiment.

FIGS. 10A to 10F are cross-sectional views during manufacture of a semiconductor device according to this embodiment. In FIGS. 10A to 10F, the same constituents as those described in the first and second embodiments will be designated by the same reference numerals as those in the embodiments and description thereof will be omitted in the following.

Moreover, since the planar layout of the semiconductor device according to this embodiment is similar to that of the second embodiment. Therefore, the plan views of the semiconductor device will also be omitted herein.

Figure 10A:
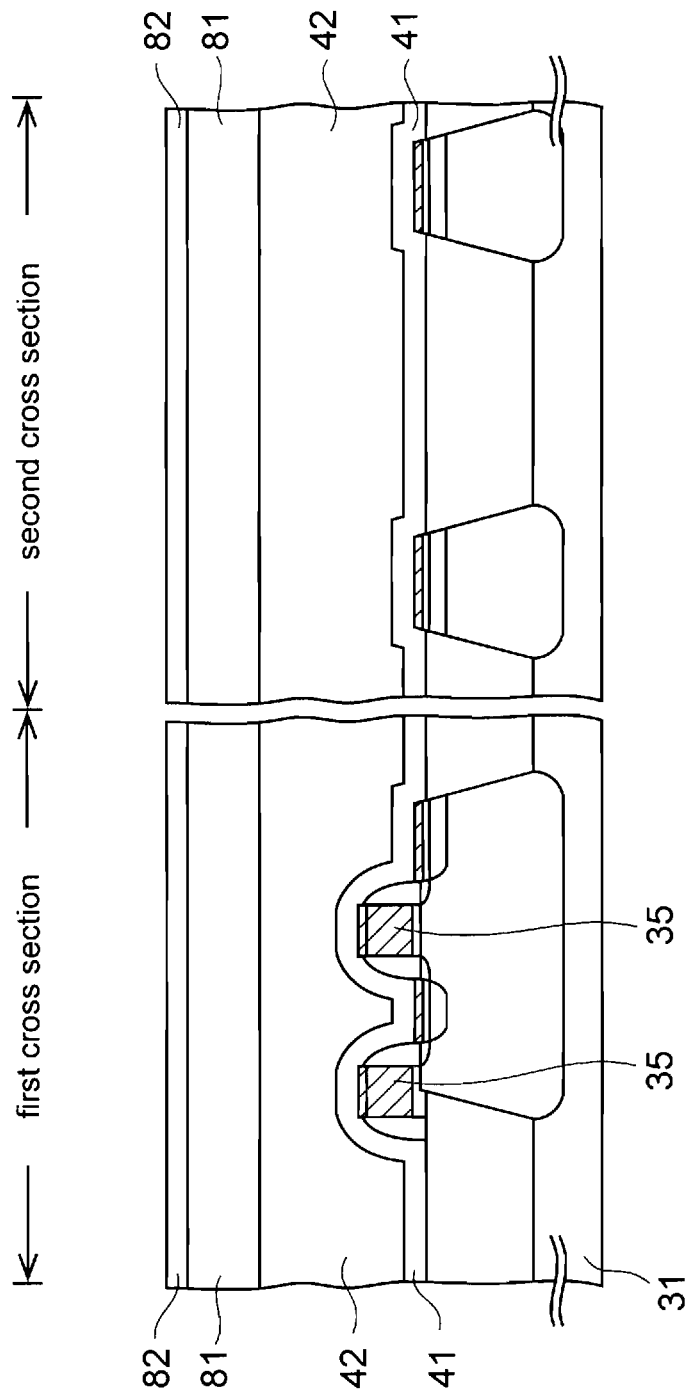
FIGS. 10A to 10F are cross-sectional views during manufacture of a semiconductor device according to a third embodiment.

To manufacture the semiconductor device according to this embodiment, the steps in the first embodiment as described in conjunction with FIGS. 5A to 5C are firstly executed, and then a second insulating film 81 is formed on the first insulating film 42 as illustrated in FIG. 10A.

The second insulating film 81 is a silicon oxycarbide film having a thickness of about 150 nm, which is formed by the CVD method, for example.

Further, a silicon oxy-nitride film serving as an antireflection insulating film 82 is formed in a thickness of about 30 nm on this second insulating film 81 by the CVD method.

Figure 10B:
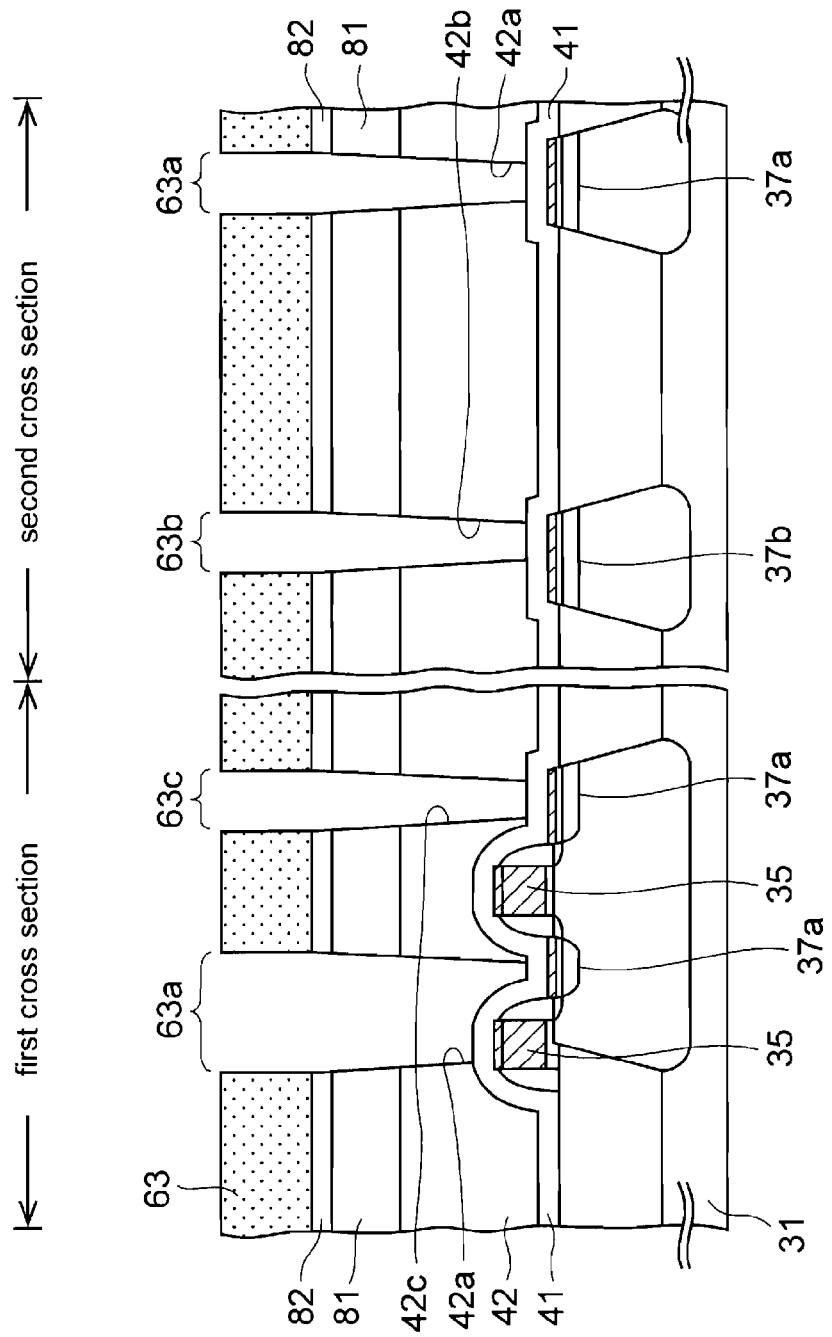

Next, as illustrated in FIG. 10B, a photoresist is coated on the antireflection insulating film 82, and the first resist pattern 63 provided with the hole-shaped windows 63a to 63c is formed by exposing and developing the photoresist.

Then, the respective insulating films 42, 81, and 82 are sequentially dry etched by the RIE while using this first resist pattern 63 as the mask, thereby forming the first to third holes 42a to 42c in these insulating films 42, 81, and 82.

The mixed gas of $C_2F_6$ gas and $CH_3$ gas is the etching gas usable in this dry etching process, for example. When using this etching gas, the etching rate of the cover insulating film 41 is lower than that of the first insulating film 42. Accordingly, this etching process stops on the upper surface of the cover insulating film 41.

Figure 10C:
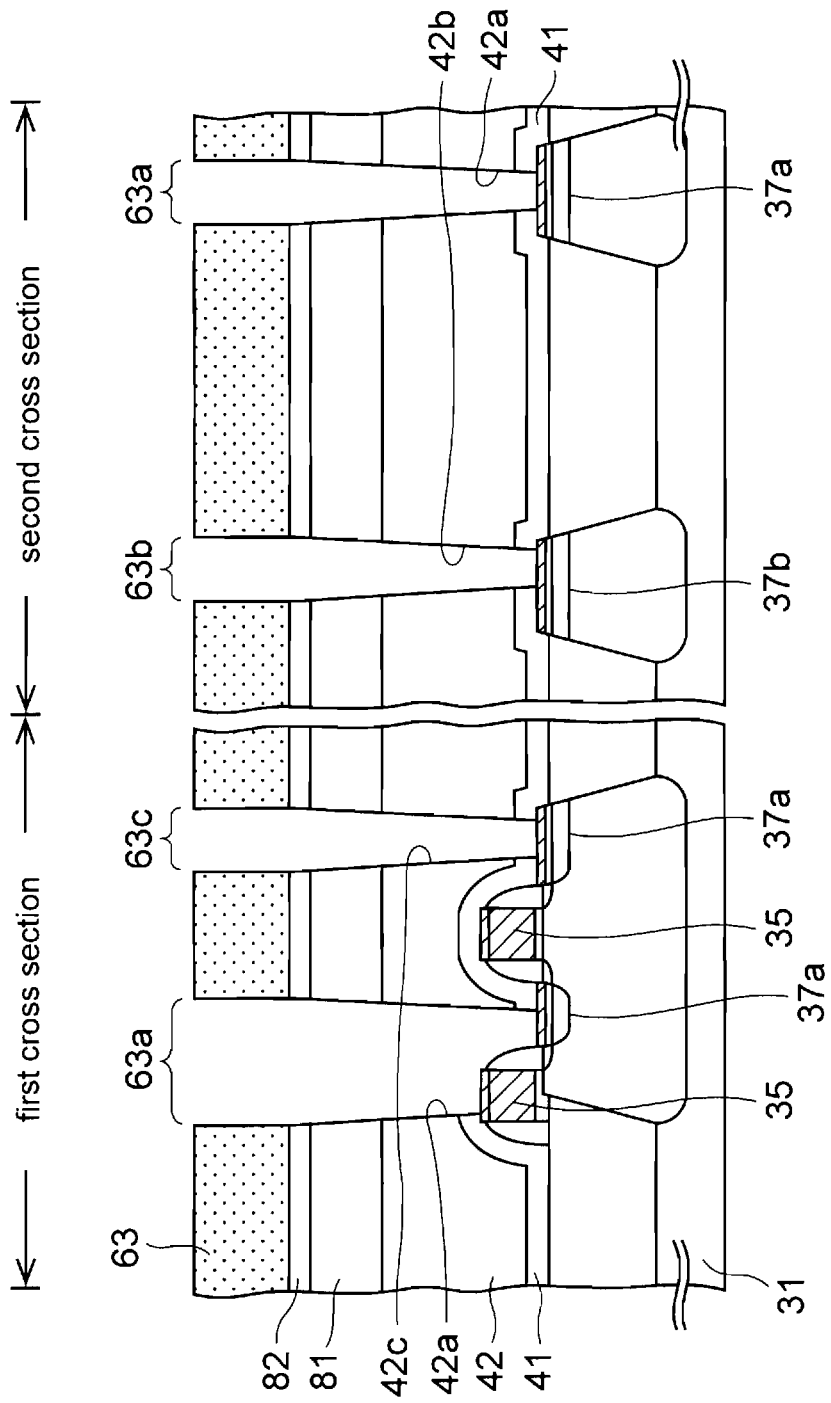

Subsequently, as illustrated in FIG. 10C, the cover insulating film 41 below the respective contact holes 42a to 42c is dry etched and removed by performing the RIE while changing the etching gas to the $CF_4$ gas.

Thereafter, the first resist pattern 63 is removed.

Figure 10D:
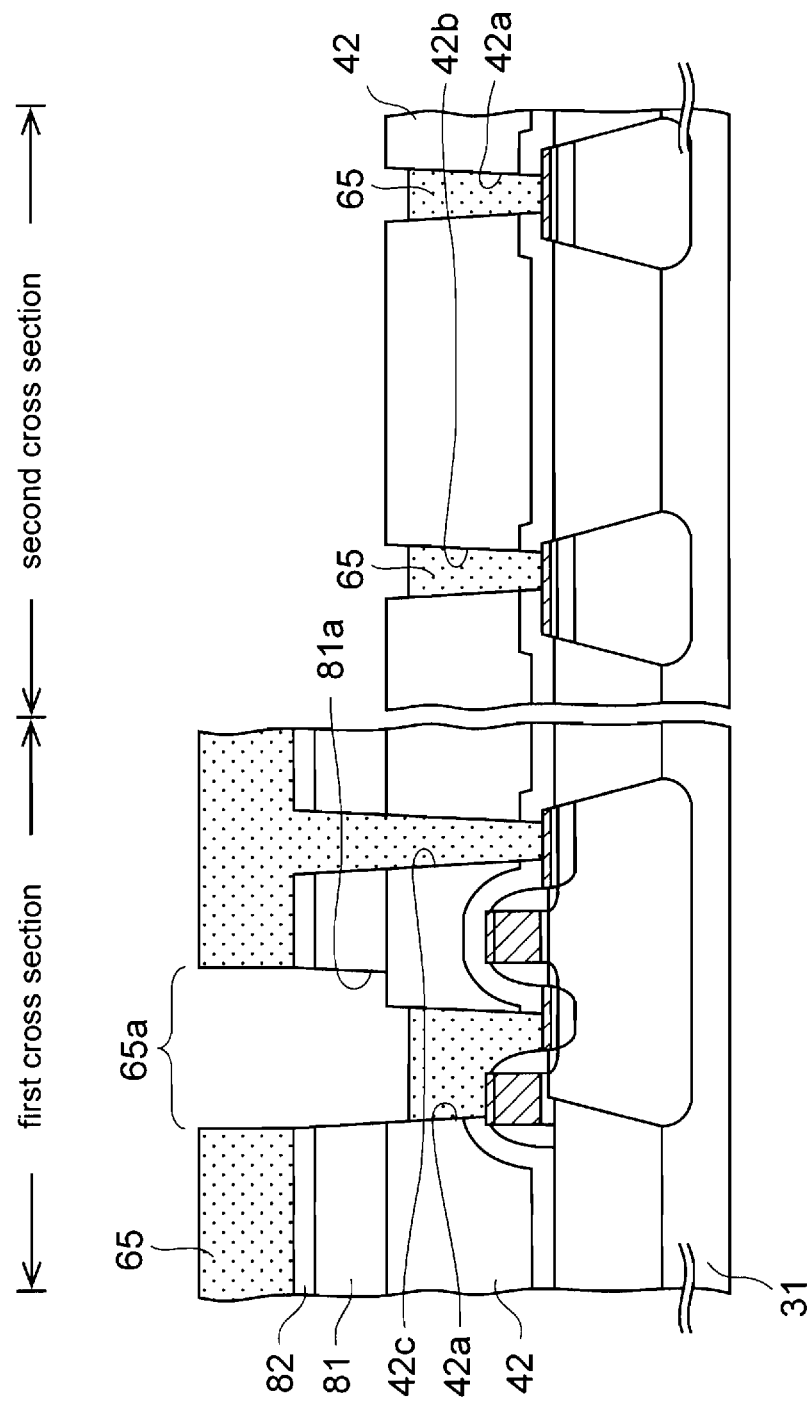

Next, as illustrated in FIG. 10D, a photoresist is coated again on the antireflection insulating film 82, and then is developed by exposure to form the second resist pattern 65 provided with the window 65a having the wiring trench shape and overlapping with the first hole 42a.

This second resist pattern 65 located bottom portions in the first hole 42a and the second hole 42b is not removed by development but is left in these holes 42a and 42b. Meanwhile, the third hole 42c is completely filled with the second resist pattern 65.

Then, the antireflection insulating film 82 and the second insulating film 81 are dry etched while using the second resist pattern 65 as the mask, thereby forming a first trench 81a exposing the first hole 42a and the second hole 42b at a bottom surface thereof.

The dry etching is performed by the RIE and etching gas containing either CHF-based gas or CF-based gas is used as the etching gas. Here, it is also possible to add inert gas such as argon gas or nitrogen gas to the etching gas.

When using such an etching gas, the etching rate of the first insulating film 42 becomes lower than that of the second insulating film 81. Accordingly, the first insulating film 42 functions as an etching stopper film, whereby the etching process stops on the upper surface of the first insulating film 42.

Thereafter, the second resist pattern 65 is removed.

Figure 10E:
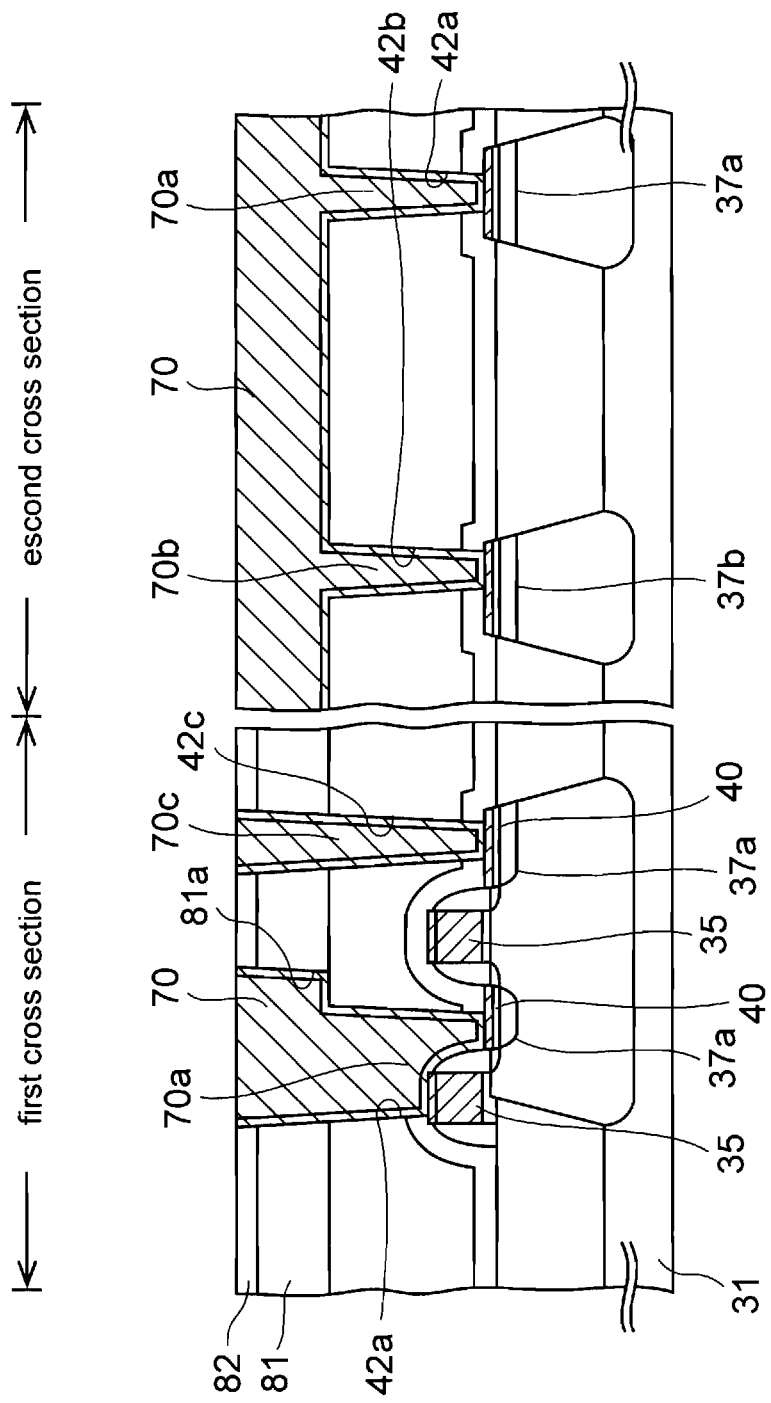

Subsequently, as illustrated in FIG. 10E, the barrier metal film, the seed layer, and the copper plated film are formed in this order in the first to third holes 42a to 42c and in the first trench 81a as similar to the second embodiment.

In this way, the first to third copper-containing plugs 70a to 70c are buried in the first to third holes 42a to 42c by the dual damascene method. Moreover, the first copper-containing interconnection 70 is formed integrally with the first and second copper-containing plugs 70a and 70b in the first trench 81a.

Figure 10F:
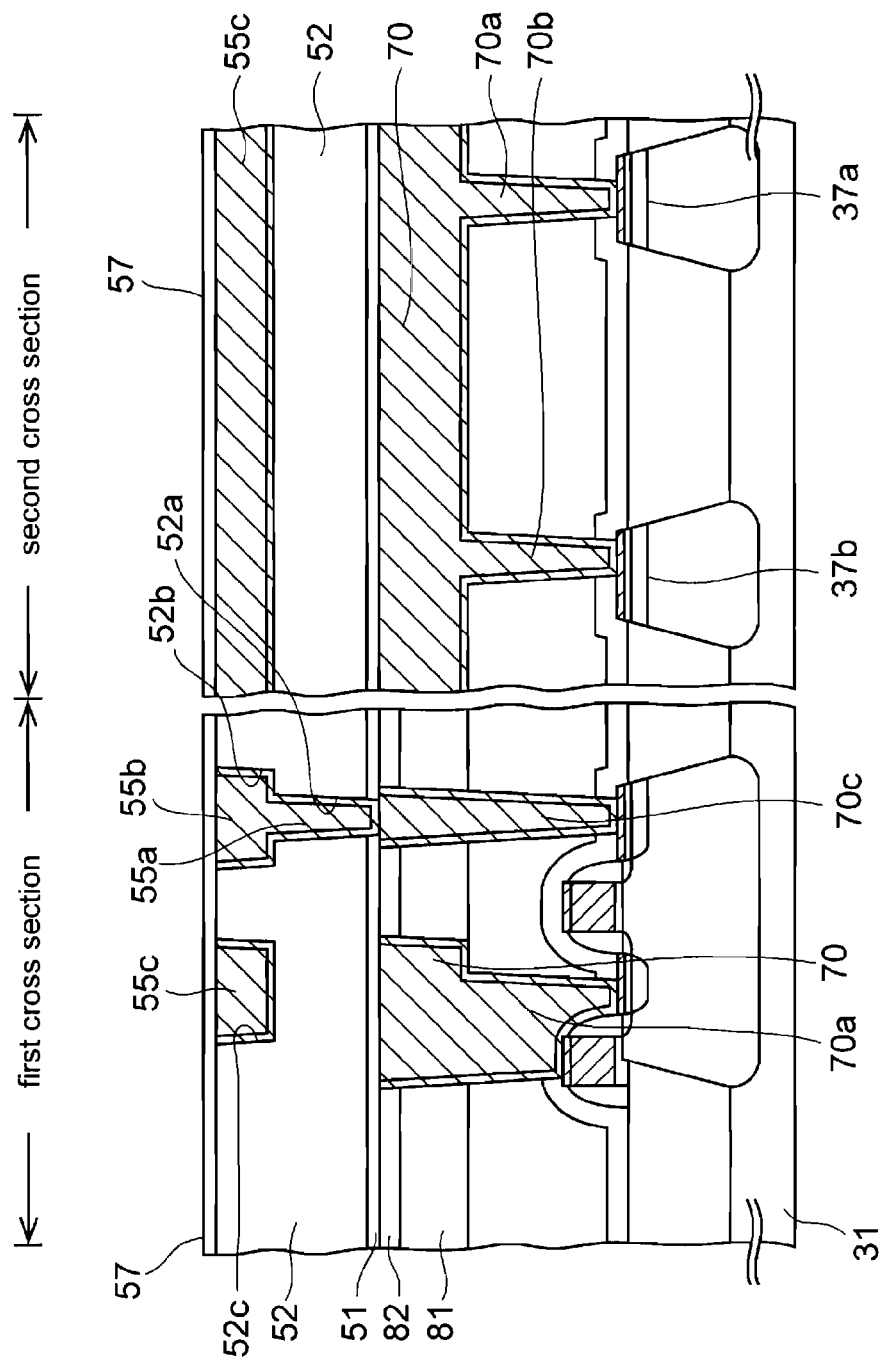

Subsequently, as illustrated in FIG. 10F, the third insulating film 52, the third copper-containing interconnection 55c constituting the word line (WL), and the like are formed by carrying out the steps in FIGS. 5H to 5J as described in the first embodiment.

Thereafter, the process goes to the steps of forming the insulating film on the entire upper surface of the silicon substrate 31 and then forming the copper-containing interconnection constituting the bit line BL is formed on the insulating film by the dual damascene method as similar to the first embodiment. However, the description thereof will be omitted.

In this way, a basic structure of the semiconductor device according to this embodiment is finished.

According to this embodiment, as illustrated in FIG. 10D, the first insulating film 42 functions as the etching stopper film by using the etching gas with which the etching rate of the first insulating film 42 becomes lower than the etching rate of the second insulating film 81. For this reason, there is no risk that the bottom surface of the first trench 81a is chamfered in this etching process. Hence it is possible to suppress reduction in the voltage resistance between the gate electrode 35 and the first copper-containing interconnection 70 as observed in the comparative example in FIG. 9C, which is attributable to reduction in the distance d therebetween.

Moreover, according to this embodiment, the first insulating film 42 is used as the etching stopper as described above. Therefore, it is not necessary to provide the etching stopper film 60 formed in the second embodiment. Hence the process can be further simplified as compared to the second embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of manufacturing a semiconductor device comprising:
   defining, in a semiconductor substrate, a first active region and a second active region by forming a device isolation insulating film over the semiconductor substrate;
   forming a gate electrode, extending in a first direction, over the device isolation insulating film and the first active region;
   forming a first insulating film over the semiconductor substrate and the gate electrode;
   forming a second insulating film over the first insulating film;
   forming a first hole, a second hole and a third hole by patterning the first insulating film and the second insulating film, the first hole having a rectangular planar shape overlapping with the gate electrode and the first active region and extending in a second direction perpendicular to the first direction, the second hole being located over the second active region;
   forming a trench by patterning the second insulating film, the trench extending from a position over the first hole to a position over the second hole; and
   forming first, second, and third plugs in the first, second, and third holes and forming an interconnection in the trench, thereby forming the interconnection integrally formed with the first plug and the second plug.

2. The method of manufacturing a semiconductor device according to claim 1, wherein;
   the first plug, the second plug and the third plug include copper.

3. A method of manufacturing a semiconductor device comprising:
   defining, in a semiconductor substrate, a first active region and a second active region by forming a device isolation insulating film in the semiconductor substrate;
   defining, in a semiconductor substrate, a third active region and a fourth active region between the first active region and the second active region, by forming the device isolation insulating film in the semiconductor substrate;
   implanting a p-type ion in the first active region and the second active region;
   implanting a n-type ion in the third active region and the fourth active region;
   forming a first gate electrode over the first active region, the third active region and the device isolation insulating film, extending in a first direction;
   forming a second gate electrode over the second active region, the fourth active region and the device isolation insulating film, extending in the first direction;
   forming a third gate electrode over the first active region, extending in the first direction;
   forming a fourth gate electrode over the second active region, extending in the first direction;
   forming a first insulating film over the first gate electrode, the second gate electrode, the third gate electrode and the fourth gate electrode;
   forming a first hole, a second hole, a third hole, a fourth hole, a fifth hole and a sixth hole penetrating through the first insulating film, the first hole exposing the second gate electrode and the third active region, the third hole exposing the first gate electrode and the fourth active region, the second hole between the first gate electrode and the third gate electrode exposing the first active region, the fourth hole between the second gate electrode and the fourth gate electrode exposing the second active region, the fifth hole in a side of the semiconductor device opposite to the first hole across the first gate electrode exposing the third active region, the sixth hole in the side of the semiconductor device opposite to the third hole across the second gate electrode exposing the fourth active region;
   forming a first trench and a second trench in the first insulating film, the first trench being over the first hole and the second hole, the second trench being over the third hole and the fourth hole;
   forming a first plug, a second plug, a third plug, a fourth plug, a fifth plug, a sixth plug, a first interconnection and a second interconnection by embedding a metal in the first hole, the second hole, the third hole, the fourth hole, the fifth hole, the sixth hole, the first trench and the second trench, respectively, the first plug having contact with the second gate electrode and the third active region, the second plug having contact with the first active region, the third plug having contact with the first gate electrode and the fourth active region, the fourth plug having contact with the second active region, the fifth plug having contact with the third active region, the sixth plug having contact with the fourth active region, the first interconnection having contact with the first plug and the second plug, the second interconnection having contact with the third plug and the fourth plug.

4. The method of manufacturing a semiconductor device according to claim 3, wherein;
   the first plug, the second plug, the third plug, the fourth plug, the fifth plug and the sixth plug include copper.

5. The method of manufacturing a semiconductor device according to claim 3, wherein;
   the first insulating film comprises a second film and a third film, the third film being over the second film.

6. The method of manufacturing a semiconductor device according to claim 5, further comprising:
   forming a fourth insulating film over the second insulating film before forming the third insulating film.

7. The method of manufacturing a semiconductor device according to claim 6, wherein;
   the first trench and the second trench expose the fourth insulating film.

8. The method of manufacturing a semiconductor device according to claim 3, further comprising:
   forming a fifth insulating film over the first insulating film; and
   forming a seventh plug in the fifth insulating film, having contact with the fifth plug, wherein;
   a diameter of the fifth plug is larger than a diameter of the seventh plug.

9. A method of manufacturing a semiconductor device comprising:
   defining, in a semiconductor substrate, a first active region and a second active region by forming a device isolation insulating film in the semiconductor substrate;
   defining, in the semiconductor substrate, a third active region and a fourth active region between the first active region and the second active region, by the forming the device isolation insulating film in the semiconductor substrate;
   implanting a p-type ion in the first active region and the second active region;
   implanting a n-type ion in the third active region and the fourth active region;
   forming a first gate electrode over the first active region, the third active region and the device isolation insulating film, extending in a first direction;

forming a second gate electrode over the second active region, the fourth active region and the device isolation insulating film, extending in the first direction;

forming a third gate electrode over the first active region, extending in the first direction;

forming a fourth gate electrode over the second active region, extending in the first direction;

forming a first insulating film over the first gate electrode, the second gate electrode, the third gate electrode and the fourth gate electrode;

forming a first hole, a second hole, a third hole and a fourth hole penetrating through the first insulating film, the first hole exposing the second gate electrode and the third active region, the third hole exposing the first gate electrode and the fourth active region, the second hole between the first gate electrode and the third gate electrode exposing the first active region, the fourth hole between the second gate electrode and the fourth gate electrode exposing the second active region;

forming a first plug, a second plug, a third plug and a fourth plug by embedding a metal in the first hole, the second hole, the third hole and the fourth hole, respectively, the first plug having contact with the second gate electrode and the third active region, the second plug having contact with the first active region, the third plug having contact with the first gate electrode and the fourth active region, the fourth plug having contact with the second active region;

forming a second insulating film over the first insulating film, the first plug, the second plug, the third plug and the fourth plug;

forming a fifth hole and a sixth hole in the first insulating film and the second insulating film by etching the first insulating film and the second insulating film at a time, the fifth hole in a side of the semiconductor device opposite to the first hole across the first gate electrode, exposing the third active region, the sixth hole in the side of the semiconductor device opposite to the third hole across the second gate electrode, exposing the fourth active region;

forming a first trench and a second trench in the first insulating, the first trench exposing the first plug and the second plug, the second trench exposing the third plug and the fourth plug;

forming a fifth plug, a sixth plug, a first interconnection and a second interconnection by embedding a metal in the fifth hole, the sixth hole, the first trench and the second trench, respectively, the fifth plug having contact with the third active region, the sixth plug having contact with the fourth active region, the first interconnection having contact with the first plug and the second plug, the second interconnection having contact with the third plug and the fourth plug.

10. The method of manufacturing a semiconductor device according to claim 9, wherein;

the first plug, the second plug, the third plug, the fourth plug, the fifth plug and the sixth plug include copper.

11. The method of manufacturing a semiconductor device according to claim 9, further comprising:

forming a third insulating film over the first insulating film before forming the second insulating film.

12. The method of manufacturing a semiconductor device according to claim 9, further comprising:

forming a fourth insulating film over the second insulating film; and forming a seventh plug in the fourth insulating film, having contact with the fifth plug, wherein a diameter of the fifth plug is larger than a diameter of the seventh plug.

* * * * *